United States Patent
Lee et al.

(10) Patent No.: US 7,595,973 B1
(45) Date of Patent: Sep. 29, 2009

(54) MULTILAYER CHIP CAPACITOR AND CIRCUIT BOARD APPARATUS HAVING THE CAPACITOR

(75) Inventors: Byoung Hwa Lee, Gyunggi-do (KR); Sung Kwon Wi, Seoul (KR); Hae Suk Chung, Seoul (KR); Dong Seok Park, Seoul (KR); Sang Soo Park, Gyunggi-do (KR); Min Cheol Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/262,909

(22) Filed: Oct. 31, 2008

(30) Foreign Application Priority Data

Aug. 13, 2008 (KR) .......................... 2008-0079442

(51) Int. Cl.
*H01G 4/228* (2006.01)
(52) U.S. Cl. .............. 361/306.3; 361/306.1; 361/321.1; 361/321.2; 361/308.1; 361/303
(58) Field of Classification Search .............. 361/306.3, 361/306.1, 306.2, 303–305, 301.4, 311–313, 361/321.1, 321.2, 308.1, 309
See application file for complete search history.

(56) References Cited

U.S. PATENT DOCUMENTS

| | | | |
|---|---|---|---|
| 5,880,925 A | 3/1999 | DuPre et al. | |
| 6,038,121 A | 3/2000 | Naito et al. | |
| 6,266,228 B1 | 7/2001 | Naito et al. | |
| 6,407,904 B1 | 6/2002 | Kuroda et al. | |
| 6,542,352 B1 * | 4/2003 | Devoe et al. | 361/321.2 |
| 6,606,237 B1 * | 8/2003 | Naito et al. | 361/306.3 |
| 6,819,543 B2 * | 11/2004 | Vieweg et al. | 361/306.3 |
| 6,940,710 B1 * | 9/2005 | Lee et al. | 361/321.2 |
| 7,035,079 B1 * | 4/2006 | Park et al. | 361/303 |
| 7,054,136 B2 * | 5/2006 | Ritter et al. | 361/309 |
| 7,310,217 B2 * | 12/2007 | Takashima et al. | 361/306.3 |

\* cited by examiner

*Primary Examiner*—Nguyen T Ha
(74) *Attorney, Agent, or Firm*—McDermott Will & Emery LLP

(57) ABSTRACT

There is provided a multilayer chip capacitor including: a capacitor body including first and second capacitor units disposed in a laminated direction; first to fourth outer electrodes formed on side surfaces of the capacitor body, respectively; and at least one connecting conductor line connecting the first and third outer electrodes having identical polarity to each other and the second and fourth outer electrodes having identical polarity to each other, wherein the first capacitor body includes first and second inner electrodes, the second capacitor unit includes a plurality of third and fourth inner electrodes, the first to fourth outer electrodes are connected to the first to fourth inner electrodes, respectively, and an equivalent series resistance (R1) of the first capacitor unit and a combined equivalent series resistance (R2') of the second capacitor and the connecting conductor line satisfy the Equation $0.7(R1) \leq R2' \leq 1.3(R1)$.

39 Claims, 24 Drawing Sheets

MULTILAYER CHIP CAPACITOR AND CIRCUIT BOARD APPARATUS HAVING THE CAPACITOR

CROSS-REFERENCE TO RELATED APPLICATIONS

This application claims the priority of Korean Patent Application No. 2008-0079442 filed on Aug. 13, 2008, in the Korean Intellectual Property Office, the disclosure of which is incorporated herein by reference.

BACKGROUND OF THE INVENTION

1. Field of the Invention

The present invention relates to a multilayer chip capacitor, and more particularly, to a multilayer chip capacitor having an adjustable and high equivalent series resistance (ESR) and a low equivalent series inductance (ESL) and capable of effectively attaining flat impedance characteristics in a wide band frequency.

2. Description of the Related Art

A high-speed micro processing unit (MPU) is continuously increased in operating frequency and consumption current, and reduced in working voltage. Therefore, it has been harder to suppress noise of a supply direct current (DC) voltage resulting from a sudden change in the MPU consumption current within a certain range, which is generally 5~10%. In order to eliminate voltage noise, a multilayer chip capacitor is widely used in a power distribution network as a decoupling capacitor. This multilayer chip capacitor supplies a current to a central processing unit (CPU) to suppress voltage noise when the MPU consumption current is suddenly changed.

Recently, with a further increase in an operation frequency of the MPU, the MPU has consumed a greater amount of current. This has led to a need for an increase in capacitance and equivalent series resistance (ESR) of the decoupling capacitor and a reduction in equivalent series inductance (ESL). This need has arisen to assure a power distribution network can have impedance maintained at a low and constant level in a broad band frequency range. Ultimately, this beneficially serves to suppress noise of the supply DC voltage resulting from a drastic change in the MPU consumption current.

In order to satisfy low ESL characteristics required for a decoupling capacitor for use in a MPU power distribution network, it has been suggested that the capacitor has outer electrodes changed in position or configuration, or inner electrodes changed in configuration, as disclosed in U.S. Pat. Nos. 5,880,925, 6,038,121, 6,266,228, and 6,407,904. These conventional technologies pertain to changing a current path inside the capacitor, that is, forming a short or multiple current loop to reduce an ESL. This ultimately leads to a decrease in ESL but entails a reduction in ESR. In the end, such a capacitor can lower impedance at a high frequency while failing to maintain the impedance of the power distribution network at a constant level due to a low ESR.

As a method for overcoming problems associated with too low ESR, outer electrodes or inner electrodes have been formed of an electrically high-resistant material to achieve high ESR characteristics. However, when high-resistant outer electrodes are employed, there arises a need to prevent localized heat spot caused by current concentration due to pinholes inside the outer electrodes. Moreover, the ESR can be hardly adjusted accurately. Also, when the inner electrodes are formed of a high resistant material, the material for the high-resistant inner electrodes needs to be matched with a ceramic material according to a change in the ceramic material due to a higher-capacity capacitor and accordingly should keep changing according to improvement or change of the ceramic material. This potentially increases the unit price for products.

SUMMARY OF THE INVENTION

An aspect of the present invention provides a multilayer chip capacitor capable of satisfying low equivalent series inductance (ESL) and high equivalent series resistance (ESR) characteristics without changing a material thereof and easily achieving flat impedance characteristics in a wide band frequency range.

An aspect of the present invention also provides a circuit board apparatus having the multilayer chip capacitor.

According to an aspect of the present invention, there is provided a multilayer chip capacitor including: a capacitor body having a plurality of dielectric layers laminated therein, the capacitor body including first and second capacitor units disposed in a laminated direction; first to fourth outer electrodes formed on side surfaces of the capacitor body, respectively, wherein the first and third outer electrodes have identical polarity to each other and the second and fourth outer electrodes have identical polarity to each other but different polarities from the first outer electrode; and at least one connecting conductor line connecting the first outer electrode and the third outer electrode to each other and the second outer electrode and the fourth outer electrode to each other, wherein the first capacitor body includes first and second inner electrodes of different polarities disposed to oppose each other while interposing a corresponding one of the dielectric layers, the second capacitor unit includes a plurality of third and fourth inner electrodes arranged alternately to oppose each other, while interposing corresponding ones of the dielectric layers, respectively, the first to fourth outer electrodes are connected to the first to fourth inner electrodes, respectively, and an equivalent series resistance of the first capacitor unit and a combined equivalent series resistance of the second capacitor and the connecting conductor line satisfy the following Equation;

$$0.7(R1) \leq R2' \leq 1.3(R1) \qquad \text{Equation,}$$

where $R2'$ is the combined equivalent series resistance of the second capacitor and the connecting conductor and $R1$ is the equivalent series resistance of the first capacitor unit.

The equivalent series resistance of the first capacitor unit may be substantially identical to the combined equivalent series resistance of the second capacitor and the connecting conductor. Particularly, to attain flat impedance characteristics in a broadband frequency range, the equivalent series resistance of the first capacitor unit, the combined equivalent series resistance of the second capacitor and the connecting conductor, a capacitance of the first capacitor unit and a combined equivalent series inductance of the second capacitor unit and the connecting conductor line may satisfy the following Equation;

$$R1 = R2' = \sqrt{L2'/C1} \qquad \text{Equation,}$$

where $R1$ is the equivalent series resistance of the first capacitor unit, $R2'$ is the combined equivalent series resistance of the second capacitor and the connecting conductor, $L2'$ is the combined equivalent series inductance of the second capacitor unit and the connecting conductor line, and $C1$ is the capacitance of the first capacitor unit.

The opposing first and second inner electrodes of the first capacitor unit may have an overlapping area smaller than an overlapping area of the opposing third and fourth inner electrodes of the second capacitor. The first and second inner electrodes of the first capacitor unit may have lengths smaller than lengths of the third and fourth inner electrodes of the second capacitor unit. The first and second inner electrodes of the first capacitor unit may have widths smaller than widths of the third and fourth inner electrodes of the second capacitor unit. The first and second inner electrodes of the first capacitor unit may have an opening therein, respectively.

The dielectric layer between the opposing first and second inner electrodes of the first capacitor unit may have a thickness greater than a thickness of the dielectric layer between the opposing first and second inner electrodes of the second capacitor unit.

A total lamination number of the inner electrodes of the second capacitor unit may be greater than a total lamination number of the inner electrodes of the first capacitor unit. The first capacitor unit may have an equivalent series resistance greater than an equivalent series resistance of the second capacitor unit. The first capacitor unit may have an equivalent series inductance smaller than an equivalent series inductance of the second capacitor unit.

The first capacitor unit may be disposed in a lower part of the capacitor body and the second capacitor unit may be disposed above the first capacitor unit.

The first capacitor unit may be divided into upper and lower portions, wherein the second capacitor unit is disposed between the upper and lower portions of the first capacitor unit and the first capacitor units are disposed above and below the second capacitor unit, respectively. Here, the connecting conductor line may include two connecting conductor lines disposed on a top and bottom of the capacitor body, respectively, and the first capacitor unit includes two first capacitor units, wherein the first capacitor units are arranged symmetrically in a laminated direction while interposing the second capacitor unit, and the multilayer chip capacitor is horizontally symmetrical.

The connecting conductor line may be formed on an outer surface of the capacitor body. Here, the at least one connecting conductor line may include a first connecting conductor line connecting the first and third outer electrodes to each other and a second connecting conductor line connecting the second and fourth outer electrodes to each other. Alternatively, the first and third outer electrodes may be connected to each other by the connecting conductor line but the second and fourth outer electrodes may not be connected to each other by the connecting conductor. Alternatively, the second and fourth outer electrodes may be connected to each other by the connecting conductor line but the first and third outer electrodes may not be connected to each other by the connecting conductor line.

The connecting conductor line may be formed on a corresponding one of the dielectric layers inside the capacitor body.

The first capacitor unit may be connected in parallel with the second capacitor unit by the connecting conductor line connecting the outer electrodes of identical polarity and the connecting conductor line may be connected in series with the second capacitor unit. The connecting conductor line may be adjusted in conductivity to control a series resistance added to the second capacitor unit. Moreover, the connecting conductor line may be adjusted in length, width or thickness to control a series resistance added to the second capacitor unit. The connecting conductor line may be formed as a thick film resistor, using screen printing, but formed as a thin film resistor, using sputtering.

The multilayer chip capacitor may be a four-terminal capacitor including a respective one of the first to fourth outer electrodes.

In the four-terminal capacitor, the first and second outer electrodes may be formed on two opposing longer side surfaces of the capacitor body and the third and fourth outer electrodes are formed on two opposing shorter side surfaces of the capacitor body.

In the four-terminal capacitor, the first and second outer electrodes may be formed on two opposing longer side surfaces of the capacitor body and the third and fourth outer electrodes are formed on two opposing shorter side surfaces of the capacitor body.

The first and second inner electrodes may be connected to the first and second outer electrodes through leads, respectively, and the leads of the first and second inner electrodes may be adjusted in width to control the equivalent series resistance of the first capacitor unit. The third and fourth inner electrodes may be connected to the third and fourth outer electrodes through leads, respectively, and the leads of the third and fourth inner electrodes may be adjusted in width to control the equivalent series resistance of the second capacitor unit.

According to another aspect of the present invention, there is provided a circuit board apparatus including: the multilayer chip capacitor defined above; and a circuit board including a mounting surface where the multilayer chip capacitor is mounted and an outer circuit electrically connected to the multilayer chip capacitor, wherein first and second pads are formed on the mounting surface of the circuit board to connect to first and second outer electrodes of the multilayer chip capacitor, respectively, and the first and second pads are directly connected to the outer circuit, the multilayer chip capacitor is arranged such that the first capacitor unit is disposed more adjacent to the mounting surface than the second capacitor unit.

An equivalent series resistance of the first capacitor unit may be greater than an equivalent series resistance of the second capacitor unit.

Vias may be formed inside the circuit board as a part of the outer circuit to connect to the first and second pads, respectively.

The at least one connecting conductor may include a first connecting conductor connecting the first and third outer electrodes to each other and a second connecting conductor connecting the second and fourth outer electrodes to each other. Here, the third and fourth outer electrodes may be connected to the outer circuit through the first and second connecting conductor lines. Also, a third pad may be formed on the mounting surface of the circuit board to connect to the third outer electrode and a fourth pad may be formed on the mounting surface of the circuit board to connect to the fourth outer electrode.

The at least one connecting conductor may include one of a first connecting conductor connecting the first and third outer electrodes to each other and a second connecting conductor connecting the second and fourth outer electrodes to each other.

The at least one connecting conductor line may include the first connecting conductor line, and a pad is additionally formed on the mounting surface of the circuit board to connect to the fourth outer electrode and directly connected to the outer circuit. Here, vias may be formed as a part of the outer circuit to connect to the pad connected to the fourth outer electrode, the first pad and the second pad, respectively.

The at least one connecting line may include the second connecting conductor line, and a pad is additionally formed on the mounting surface of the circuit board to connect to the third outer electrode and directly connected to the outer circuit. Here, vias may be formed inside the circuit board as a part of the outer circuit to connect to the pad connected to the third outer electrode, the first pad and the second pad, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
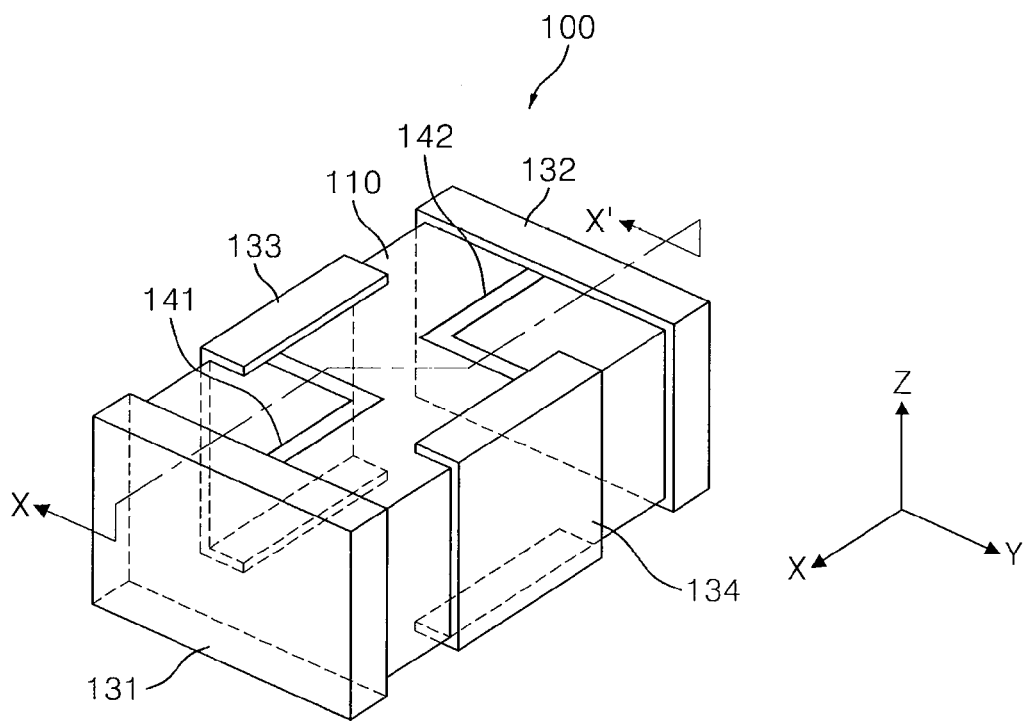
FIG. 1 is a perspective view illustrating the appearance of a multilayer chip capacitor according to an exemplary embodiment of the invention.
Figure 2:
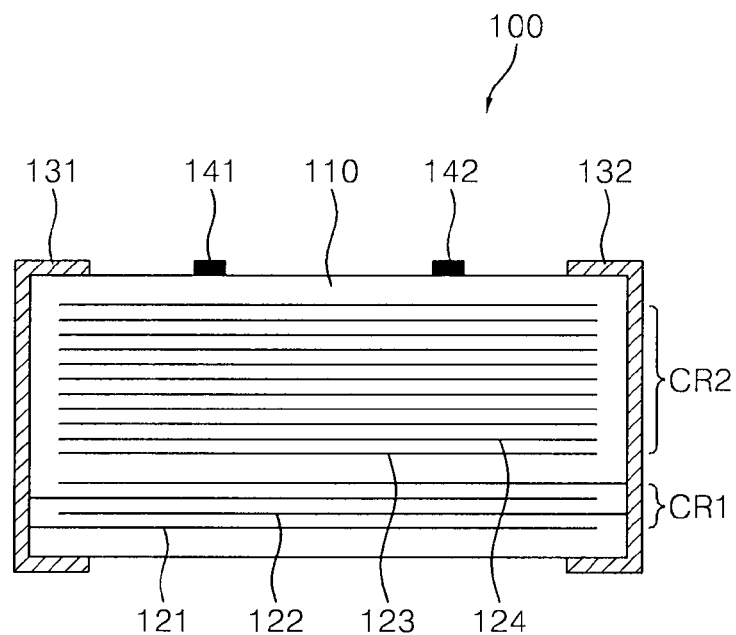
FIG. 2 is a cross-sectional view illustrating the multilayer chip capacitor of FIG. 1 taken along the line XX'.
Figure 3:
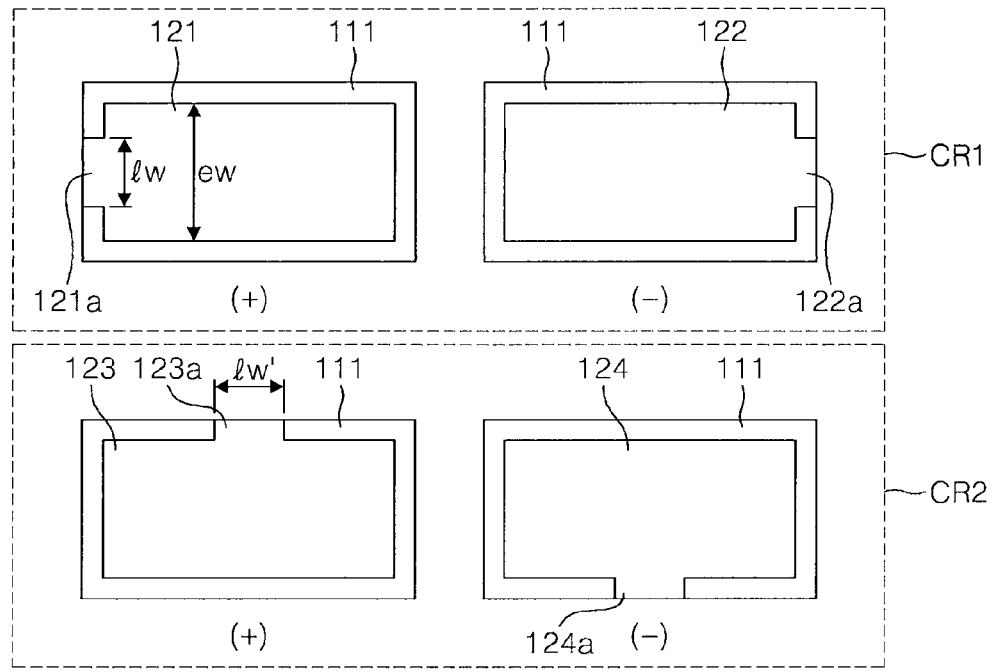
FIG. 3 is a plan view illustrating an inner electrode structure of the capacitor shown in FIG. 1.

FIG. 1 is a perspective view illustrating the appearance of a multilayer chip capacitor according to an exemplary embodiment of the invention. FIG. 2 is a cross-sectional view illustrating the multilayer chip capacitor of FIG. 1 taken along the line XX'. FIG. 3 is a plan view illustrating an inner electrode structure of the capacitor shown in FIG. 1.

Referring to FIGS. 1 to 3, the capacitor 100 includes a capacitor body 100 and first to fourth outer electrodes 131, 132, 133, and 134 formed on side surfaces of the capacitor body 100, respectively. The capacitor body 110 has a plurality of dielectric layers laminated therein and a plurality of inner electrodes 121, 122, 123, and 124 arranged alternately while interposing the dielectric layers. The first inner electrode 121 has polarity different from polarity of the second inner electrode 122 and the third electrode 123 has polarity different from polarity of the fourth inner electrode 124. The first and second outer electrodes 131 and 132 are disposed on two opposing shorter ones of the side surfaces of the body 110. The third and fourth outer electrodes 133 and 134 are disposed on the other two opposing longer ones of the side surfaces of the body 10. The capacitor 100 is configured as a four-terminal capacitor including a total of four outer electrodes but the present invention is not limited thereto.

As shown in FIGS. 2 and 3, the capacitor body 110 includes a first capacitor unit CR1 and a second capacitor unit CR2 disposed in a laminated direction, i.e., in a z axis direction. The first capacitor unit CR1 includes first and second inner electrodes 121 and 122 arranged alternately to oppose each other while interposing a corresponding one of the dielectric layers. The second capacitor unit CR2 includes third and fourth inner electrodes 123 and 124 arranged alternately to oppose each other while interposing another corresponding one of the dielectric layers.

In the first capacitor unit CR1, the first and second inner electrodes 121 and 122 are connected to the first and second outer electrodes 131 and 132 through leads 121a and 122a, respectively. In the second capacitor unit CR2, the third and fourth inner electrodes 123 and 124 are connected to the third and fourth outer electrodes 133 and 134 through leads 123a and 124a, respectively. The first and second inner electrodes 121 and 122 are directly connected to only the first and second outer electrodes 131 and 132 but not directly connected to the third and fourth outer electrodes 133 and 134. Likewise, the third and fourth inner electrodes 123 and 124 are directly connected to only the third and fourth outer electrodes 133 and 134 but not directly connected to the first and second outer electrodes 131 and 132.

The leads 121a and 122a of the first and second inner electrodes 121 and 122 can be adjusted in width lw to change the ESR of the first capacitor unit CR1. With an increase in the widths of the leads, a path of a current flowing through the leads is increased to thereby reduce resistance. Optionally, the leads of the first and second inner electrodes may have widths lw expanded as much as a width ew of an overall main part of the inner electrodes. Here, the first and second inner electrodes 121 and 122 are shaped as rectangle and connected in contact with the first and outer electrodes 131 and 132 across the width ew of the rectangle.

In the same manner, the leads 123a and 124a of the third and fourth inner electrodes 123 and 124 may have widths adjusted to control an ESR of the second capacitor unit CR2. Moreover, the leads 123a and 124a of the third and fourth inner electrodes 123a and 124a may have widths expanded as much as lengths of the longer side surfaces of the overall main part of the inner electrodes. The change in the widths of the leads influences not only ESR but also ESL.

As shown in FIGS. 1 and 2, the first outer electrode 131 of the first capacitor unit CR1 is connected to the third outer electrode 133 of the second capacitor unit CR2 through a connecting conductor line 141. The second outer electrode 132 of the first capacitor unit CR1 is connected to the fourth outer electrode 134 of the second capacitor unit CR2 through a connecting conductor line 142. These connecting conductor lines 141 and 142 serve as a kind of conductive resistor. The connecting conductor lines 141 and 142 connect the first capacitor unit CR1 and the second capacitor unit CR2 in parallel to each other and serve to connect an additional resistance in series to the second capacitor unit CR2.

In the present embodiment, the connecting conductor lines 141 and 142 are disposed on a top of the body but the present invention is not limited thereto. For example, the connecting conductor lines 141 and 142 may be disposed only on a bottom of the body. Alternatively, the connecting conductor lines 141 and 142 may be disposed on the top and bottom of the body, respectively. Furthermore, the connecting conductor lines may be arranged on the side surfaces of the body, or the side surfaces, top and bottom of the body, respectively. That is, the connecting conductor lines may be appropriately arranged on an outer surface of the capacitor body to connect the outer electrodes of identical polarity together. However, as in the present embodiment, when the capacitor body has an inner structure horizontally asymmetrical (see FIG. 2), the connecting conductor lines 141 and 142 may be beneficially formed on the top of the capacitor body 110 to easily distinguish the top and bottom of the capacitor from each other.

As shown in FIG. 3, the first capacitor unit CR1 is located on at least one end of the laminated direction, i.e., z axis direction. As will be described later, the capacitor is mounted on a circuit board such that the first capacitor unit CR1 is more adjacent to the mounting surface of the circuit board than the second capacitor unit CR2. Particularly, in the present embodiment, the first capacitor unit CR1 is located at one end, i.e., lower part of the body in a laminated direction and the second capacitor unit CR2 is located above the first capacitor unit CR1. Here, the lower part or bottom of the capacitor denotes a portion or surface adjacent to the mounting surface when the capacitor is mounted on the board. The first capacitor unit CR1 and the second capacitor unit CR2 are connected in parallel to each other by the outer electrodes 131 to 134 and the connecting conductor lines 141 and 142.

The first capacitor unit CR1 is laminated in a limited number in order to have an appropriate ESR and thus the first capacitor unit CR1 includes the inner electrodes laminated in a fewer number than the second capacitor unit CR2. Therefore, to achieve desired or predetermined capacitance, the second capacitor unit CR2 connected in parallel to the first capacitor unit is mostly utilized. To assure this capacitance, a total lamination number of the third and fourth inner electrodes 123 and 124 of the second capacitor unit CR2 is greater than a total lamination number of the first and second inner electrodes 121 and 122 of the first capacitor unit CR1. In the end, the second capacitor unit CR2 has a capacitance greater than a capacitance of the capacitor unit CR1 and the second capacitor unit CR2 has an ESR smaller than an ESR of the first capacitor unit CR1 including a fewer number of inner electrodes.

Figure 4:
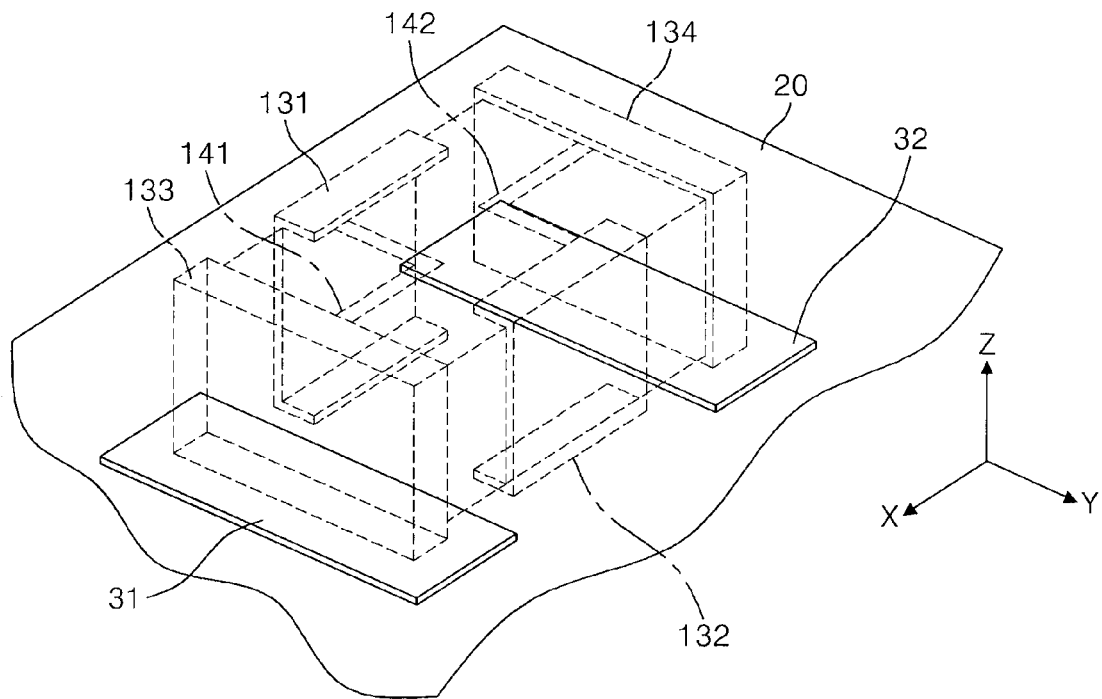
FIG. 4 is a perspective view illustrating a circuit board apparatus having the capacitor of FIG. 1 mounted on a circuit board.

FIG. 4 illustrates a circuit board apparatus according to an exemplary embodiment of the invention, in which the capacitor 100 of FIG. 1 is mounted on a circuit board 20. Referring to FIG. 4, first and second pads 31 and 32 are formed on a mounting surface of the capacitor of the circuit board 20. The first and second mounting pads 31 and 32 are electrically connected to outer circuits formed on the circuit board 20. The capacitor 100 is disposed on the mounting surface such that the first capacitor unit CR1 having a higher ESR than the second capacitor unit CR2 is located adjacent to the mounting surface.

The first pad 31 of the circuit board 20 is connected to the first outer electrode 131 of the capacitor and the second pad 32 is connected to the second outer electrode 132. Accordingly, the first pad 31 has a first polarity, for example, positive polarity identical to polarities of the first and third outer electrodes 131 and 133 and the second pad 32 has a second polarity, for example, negative polarity identical to polarities of the second and fourth outer electrodes 132 and 134. The first capacitor unit CR1 and the second capacitor unit CR2 are connected in parallel to each other by the connecting conductor lines 141 and 142. Here, the first and second pads 31 and 32 are directly connected to the outer circuits, for example, vias of the circuit board 20 (see FIGS. 7 and 8).

Therefore, the first and second outer electrodes of the first capacitor unit CR1 act as a terminal electrode and are directly connected to the outer circuits of the circuit board 20. The third and fourth outer electrodes of the second capacitor unit CR2 are electrically connected to the outer circuits by the connecting conductor lines 141 and 142 and the first and second outer electrodes 131 and 132.

The connecting conductor lines 141 and 142 connect the outer electrodes of identical polarity together to thereby connect the first and second capacitor units CR1 and CR2 in parallel to each other. Moreover, the connecting conductor lines 141 and 142 add series resistance to the capacitor unit CR2, which is a function substantially identical to the adjustment of ESR of the second capacitor unit. Accordingly, the capacitor 100 of the present invention mounted on the pad structure of the circuit board 20 assures the substantially same effect that the ESR of the second capacitor unit CR2 becomes similar to the ESR of the first capacitor unit CR1. This leads to the adjustment of ESR of the multilayer chip capacitor. As will be described later, a combined equivalent series resistance $R2'$ of the second capacitor unit and the connecting conductor lines is identical or substantially identical to an equivalent series resistance R1 of the first capacitor unit ($R1=R2'$) to satisfy one of necessary conditions for achieving flat impedance characteristics in a wide band frequency.

Figure 5A:
FIGS. 5A to 5C are equivalent circuit diagrams illustrating a first capacitor unit, a second capacitor unit and a multilayer chip capacitor mounted on a circuit board, in the circuit apparatus of FIG. 4, respectively.
Figure 5B:
Figure 5C:
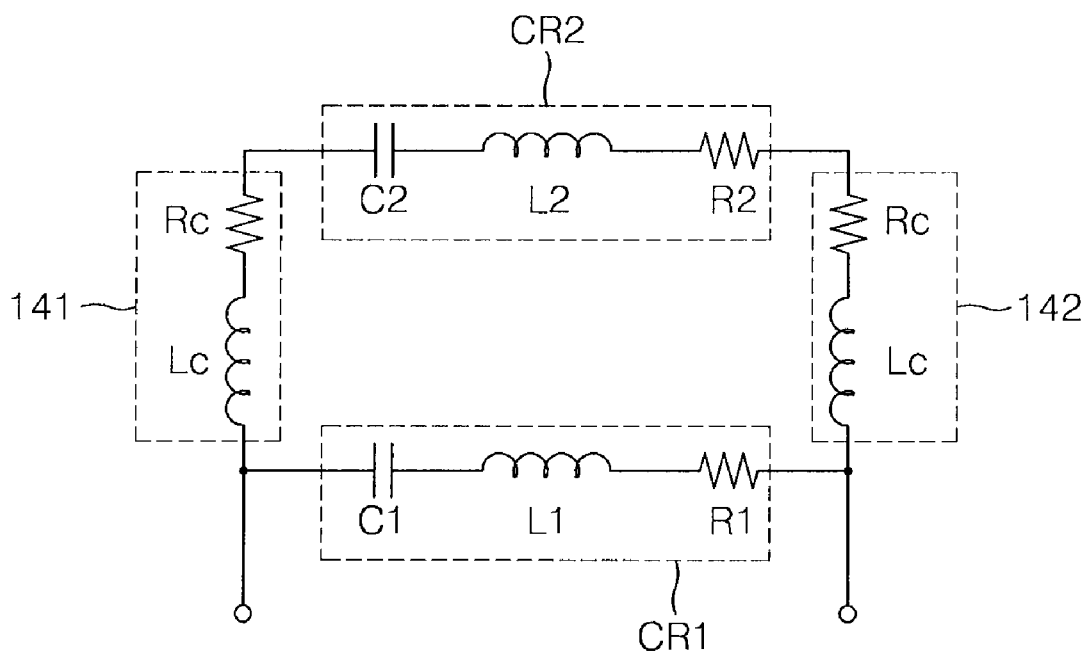

FIGS. 5A to 5C are equivalent circuit diagrams illustrating a first capacitor unit, a second capacitor unit and a multilayer chip capacitor in the circuit board apparatus 100 of FIG. 4 where the capacitor 100 is mounted on a circuit board 20, respectively. As shown in FIGS. 5A and 5B, an equivalent circuit of the first capacitor unit CR1 of the capacitor 100 can be denoted with a series circuit including capacitance C1, inductance L1 and resistance R1. Likewise, an equivalent circuit of the second capacitor unit CR2 can be denoted with a series circuit of capacitance C2, inductance L2 and resistance R2. Here, as described above, C1<C2 and R1>R2.

The first and second capacitor units CR1 and CR2 are connected in parallel to each other by the connecting conductor lines 141 and 142 and an outer circuit terminal is connected to the first capacitor CR1. Thus, as shown in FIG. 5C, resistances Rc and inductances Lc of the first and second connecting conductor lines 141 and 142 are added in series to the resistance R2 and inductance L2 of the second capacitor unit CR2. Accordingly, a series circuit part 141-CR2-142 is connected in parallel with an equivalent circuit part C1-L1-R1 of the first capacitor unit CR1. Referring to FIG. 5C, the first connecting conductor line 141 and the second connecting conductor line 142 are identical in resistance Rc and inductance Lc to each other, but the present invention is not limited thereto. The connecting conductor lines 141 and 142 may differ in resistance or inductance from each other.

Figure 6:
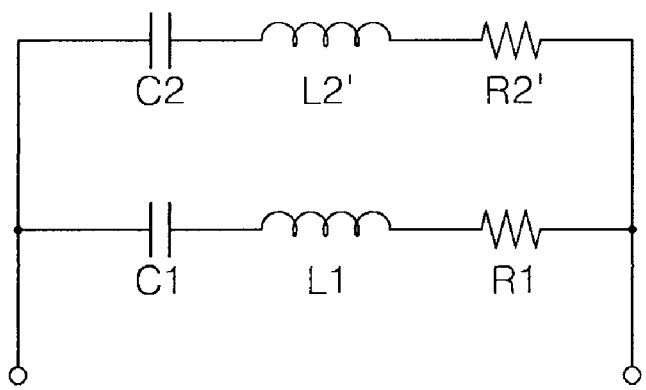
FIG. 6 is an equivalent circuit diagram which is a simpler representation of FIG. 5C.

The equivalent circuit of FIG. 5C may be represented more simply as in FIG. 6, in which an $R2'$-$L2'$-$C2'$ circuit part is connected in parallel with an R1-L1-C1 circuit part. Referring to FIG. 6, $L2'$ and $R2'$ denote a combined inductance and a combined resistance of the connecting conductor lines 141 and 142 and the second capacitor unit CR2, respectively and satisfy following Equation 1.

$$L2'=L2+2Lc, R2'=R2+2Rc \qquad \text{Equation 1}$$

Accordingly, the connecting conductor lines 141 and 142 add resistance 2Rc and thus substantially assure the effect of increasing an ESR of the second capacitor unit CR2. This allows an ESR of the entire capacitor to be adjusted easily or increased.

Furthermore, an equivalent series resistance R1 of the first capacitor unit and a combined equivalent series resistance $R2'$ of the second capacitor unit and the connecting conductor lines satisfy the relation $0.7(R1) \leq R2' \leq 1.3(R1)$. This increases an ESR of the entire multilayer chip capacitor and reduces impedance deviations in a wide frequency range covering a resonance frequency $SRF2'$ of the $R2'$-$L2'$-$C2'$ circuit part to a resonance frequency SRF1 of the R1-L1-C1 circuit part.

To maintain impedance magnitude at a constant level, the equivalent series resistance R1 of the first capacitor unit and the combined equivalent series resistance $R2'$ of the second capacitor unit and the connecting conductor lines are adjusted to be substantially identical. At this time, impedance corresponding to a resonance frequency of the first capacitor unit CR1 is substantially identical in magnitude to impedance corresponding to a resonance frequency of a combined circuit part of the second capacitor unit CR2 and the connecting conductor lines. Accordingly, the impedance of the entire capacitor is restrained from changing drastically but maintained at a relatively constant level in a relatively wide range covering a resonance frequency of the combined circuit part of the second capacitor unit CR2 and the connecting conductor lines to a resonance frequency of the first capacitor unit CR1.

The relation between R1 and $R2'$, in which $(0.7(R1) \leq R2' \leq 1.3(R1)$, or R1 and $R2'$ are substantially identical to each other, can be equally applied not only to the present embodiment but also other embodiments (see FIGS. 9A to 36, and 39 to 41).

Notably, in the present embodiment, to attain flat impedance characteristics in a wide band frequency range, the equivalent series resistance R1 of the first capacitor unit CR1 is identical to the combined resistance $R2'$ of the connecting conductor lines and the second capacitor unit, and also identical to $L2'/C1$ square root to thereby satisfy following Equation 2.

$$R_1 = R_2' = \sqrt{\frac{L_2'}{C_1}} \qquad \text{Equation 2}$$

Equation 2 can be derived from the condition that a parallel circuit of FIG. 6, has a constant impedance in a frequency range covering the resonance frequency of a $R2'$-$L2'$-$C2'$ circuit part to the resonance frequency of an R1-L1-C1 circuit part.

More specifically, in a frequency range covering the resonance frequency $SRF2'$ of the $R2'$-$L2'$-$C2'$ circuit part to the resonance frequency SRF1 of the R1-L1-C1 circuit part, the R1-L1-C1 circuit part is approximated to R1-C1, that is, L1 is eliminated or ignored at a frequency of SRF1 or less. Also, the R2'-L2'-C2' circuit part is approximated to R2'-L2', that is, C2' is eliminated or ignored at a frequency of SRF2' or more. Therefore, in a frequency range of SRF2' to SRF1, an impedance Z1 of the R1-L1-C1 circuit part can be approximated to Z1=R1+j(1/ωC1) and an impedance Z2' of the R2'-L2'-C2' circuit part can be approximated to Z2'=R2'+jωL1. Here, ω denotes a frequency. At this time, the impedance Z1 of R1-C1 is connected in parallel with the impedance Z2' of R2'-L2' and thus a combined impedance Z of Z1 and Z2 can be expressed as following Equation 3 when 1/Z=1/Z1+1/Z2'.

$$Z = R_1 + \frac{j\omega(L_2' - C_1 R_1^2) + (R_2' - R_1)}{j\omega C_1 (R_2' + R_1) + 1 - \omega^2 L_2' C_1} \quad \text{Equation 3}$$

To ensure flat characteristics of an overall impedance Z in a broadband frequency range of SRF2' to SRF1, the respective resonant frequencies i.e., SRF1 and SRF2' should have impedance identical to each other and the impedance at a frequency between the SRF1 and SRF2 should be identical to the impedance at each resonance frequency, thereby satisfying R1=R2'=Z when SRF2'≦ω≦SRF1. Here, the impedance at a resonance frequency is denoted with only resistances R1 and R2' since an imaginary number is eliminated.

Therefore, following Equation 4 can be derived by applying R1=R2'=R, where R1 and R2' are denoted with one letter R, to the Equation 3.

$$Z = R + \frac{jw(L - C_1 R^2)}{2jwC_1 R + 1 - w^2 L_2' C_1} \quad \text{Equation 4}$$

Figure 37:
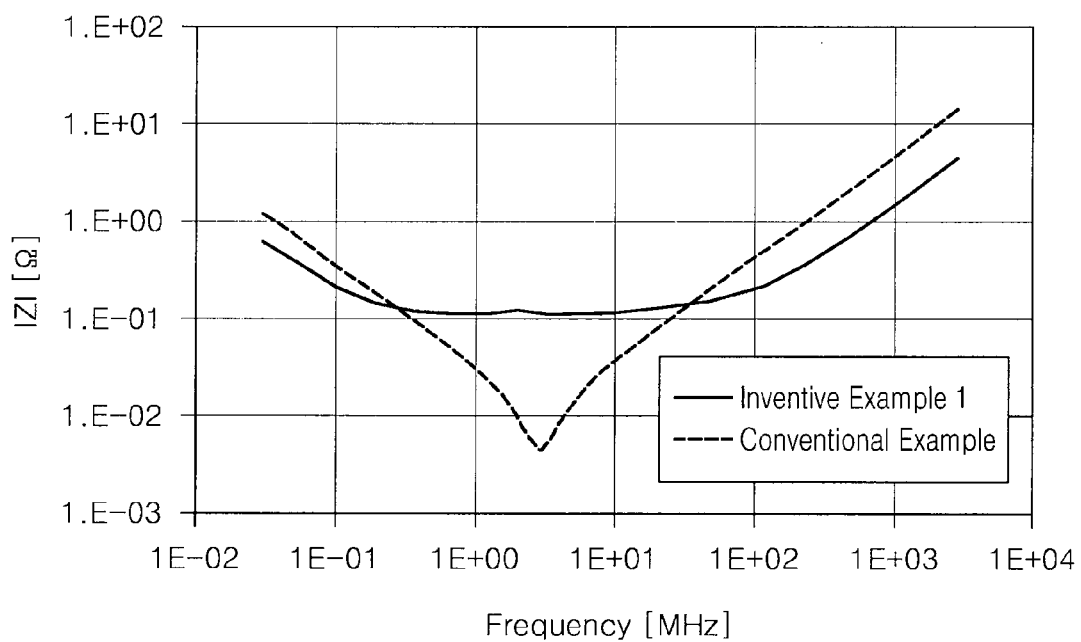
FIG. 37 is a graph illustrating frequency vs. impedance characteristics of a multilayer chip capacitor according to an exemplary embodiment and a conventional multilayer chip capacitor.
Figure 38:
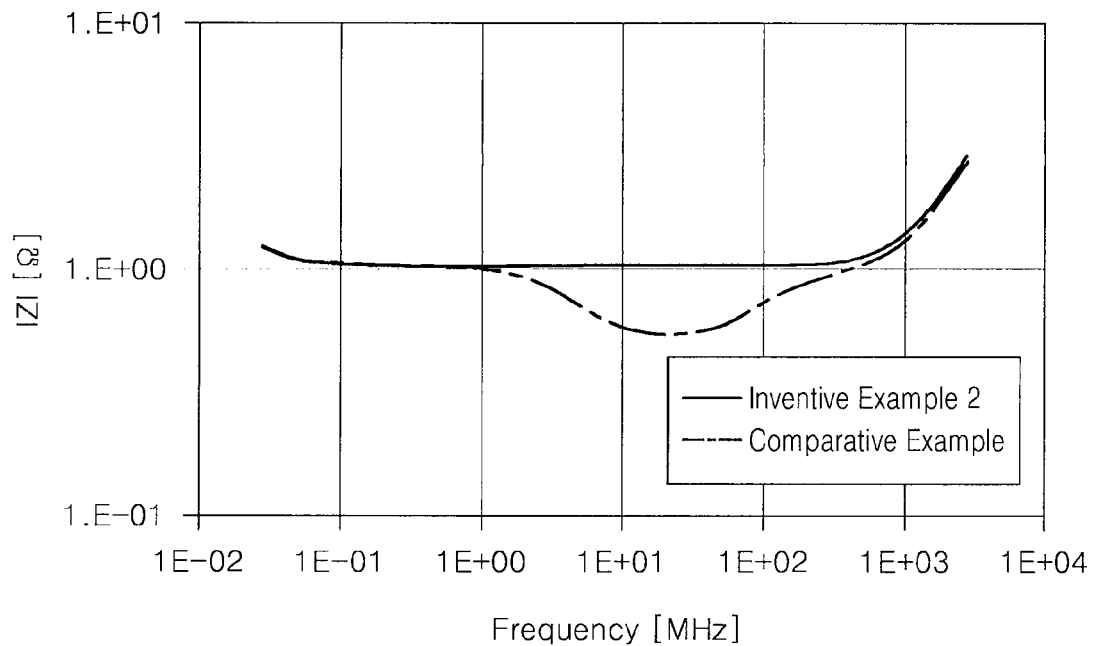
FIG. 38 is a graph illustrating a frequency vs. impedance characteristics of a multilayer chip capacitor according to another exemplary embodiment of the invention and a conventional multilayer chip capacitor.

From the condition of Z=R in SRF2'≦ω≦SRF1, the numerator of the right side of Equation 4 should be 0 and thus $$R = R_1 = R_2 = \sqrt{\frac{L_2'}{C_1}}$$

is satisfied to obtain the Equation 2 described above. In the end, the condition $$R_1 = R_2' = \sqrt{\frac{L_2'}{C_1}}$$

is satisfied to ensure flat impedance characteristics in a wide band frequency range, particularly, frequency range covering a frequency range indicated with a valley shape in a conventional frequency vs. impedance characteristics graph (see FIGS. 37 and 38). Accordingly, this leads to a stable MPU power distribution network.

As described above, capacitance of the entire capacitor is primarily attained by the second capacitor unit. Therefore, the second capacitor unit CR2 has inner electrodes laminated in a greater number than the first capacitor unit CR1, and accordingly has an ESR R2 smaller than an ESR R1 of the first capacitor unit CR2. These ESR differences prevent the impedance from being maintained at a constant level. Notably, steep valley areas occur near the each resonance frequency. However, the connecting conductor lines 141 and 142 add series resistance 2Rc to assure the substantial effect of increasing an ESR of the second capacitor unit CR2. This increases an ESR of the entire capacitor and reduces differences in ESR (R1 and R2') of the two circuit parts. Moreover, the aforesaid condition $$R_1 = R_2' = \sqrt{\frac{L_2'}{C_1}}$$

is satisfied to ensure flat impedance characteristics in a broadband frequency range.

As shown in the Equation 1, the connecting conductor lines 141 and 142 allow inductance 2Lc to be added to the ESL of the second capacitor unit CR2. Regardless of this substantial increase in the ESL of the second capacitor unit CR2, the ESL and impedance of the entire multilayer chip capacitor in a high frequency range is mostly affected by the ESL of the first capacitor unit CR1. This is because impedance is mostly governed by inductance at a high frequency and due to the first capacitor unit CR1 disposed in proximity to the mounting surface, current at a high frequency band forms a current loop on a short path through the first capacitor unit CR1. In the end, according to the present embodiment, an adjustable and high ESR can be easily attained, flat impedance characteristics are assured in a broadband frequency range, and a relatively low ESL value can be maintained at a high frequency band of the entire capacitor (FIGS. 37 and 38).

The connecting conductor lines 141 and 142 allow series resistance 2Rc and inductance 2Lc to be added to the second capacitor unit CR2, and these series resistance 2Rc and inductance 2Lc can be can be controlled by adjusting conductivity through suitable selection of a material for the connecting conductor lines or adjusting length, width or thickness of the connecting conductor lines. The connecting conductor lines 141 and 142 may be formed of ruthenium oxide or tungsten. Particularly, to satisfy the aforesaid condition $$R_1 = R_2' = \sqrt{\frac{L_2'}{C_1}},$$

the connecting conductor lines need to have a resistance satisfying 2Rc=R1-R2. These connecting conductor lines can be formed by a thin film growth process such as sputtering or thick film growth process.

The formation of the connecting conductor lines 141 and 142 may precede or follow sintering of the chip capacitor according to a sintering temperature of a material thereof. In a case where the connecting conductor lines are sintered at a relatively high temperature similar to a sintering temperature of the chip capacitor, the connecting conductor lines, after being formed, can be sintered simultaneously with the chip capacitor. On the other hand, in a case where the connecting conductor lines are sintered at a lower temperature than the sintering temperature of the chip capacitor, the connecting conductor lines are formed after sintering the chip capacitor, and then sintered.

Figure 7:
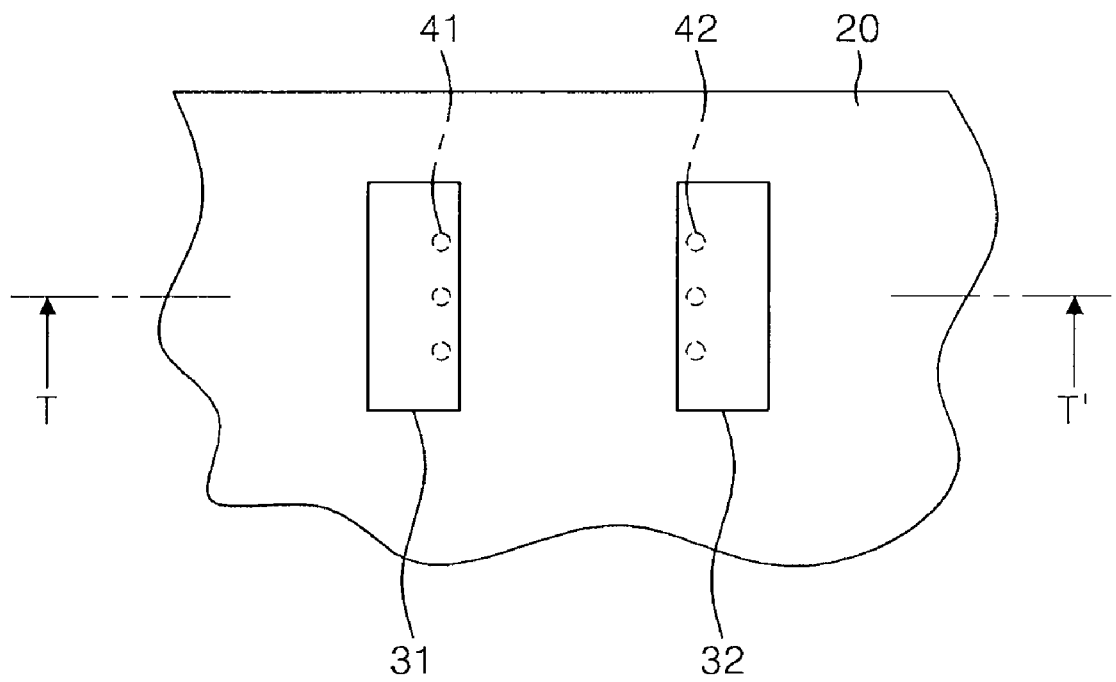
FIG. 7 is a schematic plan view illustrating a circuit board shown in FIG. 4.
Figure 8:
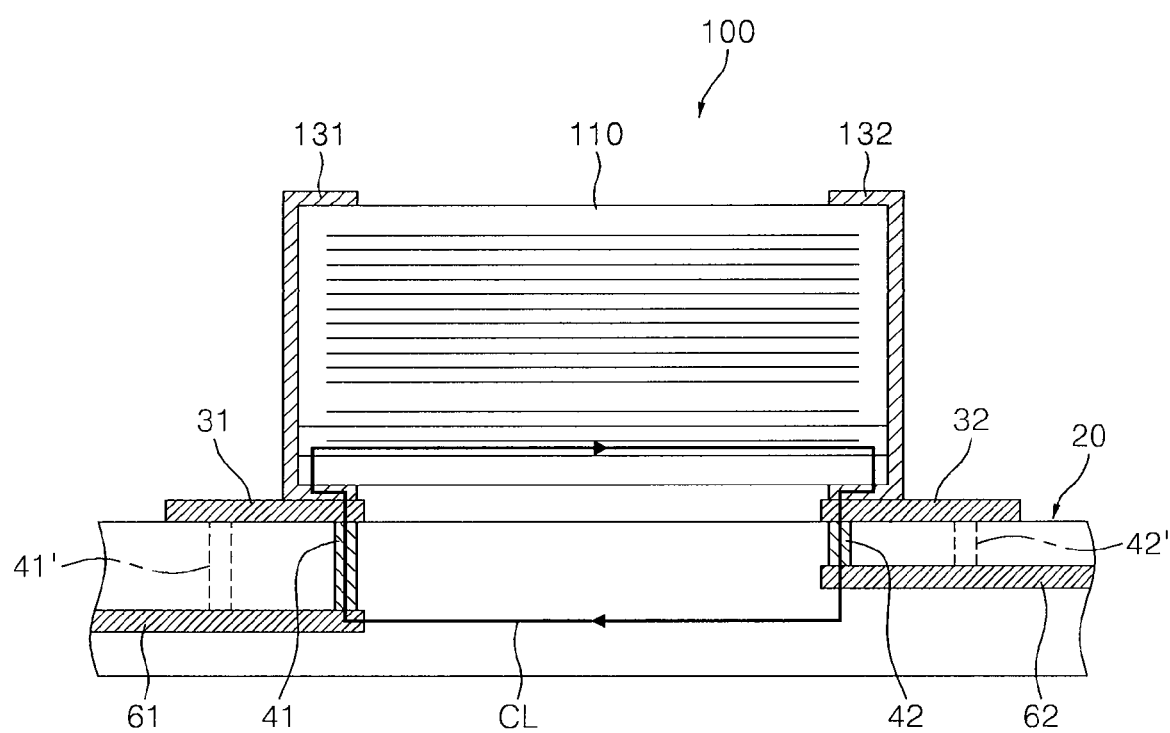
FIG. 8 is a cross-sectional view illustrating the circuit board apparatus of FIG. 4.

FIG. 7 is a schematic plan view illustrating the circuit board shown in FIG. 4 and FIG. 8 is a cross-sectional view illustrating the circuit board apparatus of FIG. 4 taken along the line TT'. Referring to FIGS. 7 and 8, the mounting pads 31 and 32 are disposed on the circuit board 20 and vias 41 and 42 are formed in the circuit board 20 as a part of the outer circuits, for example, circuits for applying a power voltage to a decoupling capacitor. These vias 41 and 42 are directly connected to the first and second pads 31 and 32 connected to the first capacitor unit. The first pad 31 is connected to a first conductive pattern, for example, a power electrode pattern 61 through the via 41 and the second pad 32 may be connected to a second conductive pattern, for example, a ground electrode pattern 62 through the via 42.

As described above, the first and second outer electrodes 131 and 132 disposed at end side portions of the capacitor body are connected to the first and second pads 31 and 32 of the circuit board 20. Therefore, according to the present embodiment, a conventional two-terminal capacitor in which two mounting pads are provided to mount the capacitor may be employed. This compatibility of the circuit board advantageously reduces overall manufacturing costs of the circuit board apparatus.

As shown in FIG. 8, the via 41 connected to the first pad 31 is located adjacent to the second pad 32 and the via 42 connected to the second pad 32 is located adjacent to the first pad 31. Greater proximity of the vias 41 and 42 with different polarities reduces the size of a current loop CL of a current flowing in the first capacitor unit through the first and second pads 31 and 32, thereby decreasing inductance by the current loop. In a case where the vias 41' and 42' with different polarities are disposed at a great distance from each other as indicated with a dotted line as shown in FIG. 8, the current loop is increased commensurately and the inductance is increased by the current loop.

Also, each of the first and second pads 31 and 32 may be connected to at least two vias. For example, FIG. 7 shows the first and second pads each connected to three vias. This is because the at least two vias formed allow inductances by the current loop to be connected in parallel to thereby further reduce an overall inductance.

Referring to the above Equation 2, to ensure that the multilayer chip capacitor has a gradually higher ESR and maintains flat impedance characteristics in a wide band frequency, the inductance of the connecting conductor lines 141 and 142 should be gradually increased. That is, in the flat impedance condition at a wide band satisfying $$R_1 = R_2' = \sqrt{\frac{L_2'}{C_1}},$$

an increase in ESR of the entire capacitor brings about an increase in R1, also requiring L2' to be increased. This means that without any change in materials, the connecting conductor lines 141 and 142 should be continuously increased in length. However, in case of seeking to obtain a significantly increased ESR, the capacitor body may be spatially not sufficient to have the connecting conductor lines with high inductance and particularly a very big length therein.

For example, in a case where each of the connecting conductor lines 141 and 142 has about 1 nH of inductance, the capacitor 100 has 100 mΩ of ESR while achieving flat impedance characteristics in a wide band frequency. However, in order to ensure that the capacitor 100 has a significantly increased ESR of 900 mΩ while attaining flat impedance characteristics, the each connecting conductor line should possess about 10 nH of inductance. However, the inductance of the connecting conductor line easily configurable in the capacitor body is, for example, maximum 1 nH, and 10 nH of inductance can be hardly realized.

In the condition $$R_1 = R_2' = \sqrt{\frac{L_2'}{C_1}},$$

the first capacitor unit CR1 may be reduced in capacitance C1 to ensure flat impedance characteristics and high ESR as well in a wide band frequency range. That is, with the capacitance C1 of the first capacitor unit CR1 fixed, the connecting conductor lines are increased in inductance Lc and the first capacitor unit CR1 is decreased in capacitance C1. This allows for a reduction in impedance of the connecting conductor lines which is necessary for ensuring a high ESR, for example, 100 mΩ or more of ESR and flat impedance characteristics in a wide band frequency.

Figure 9A:
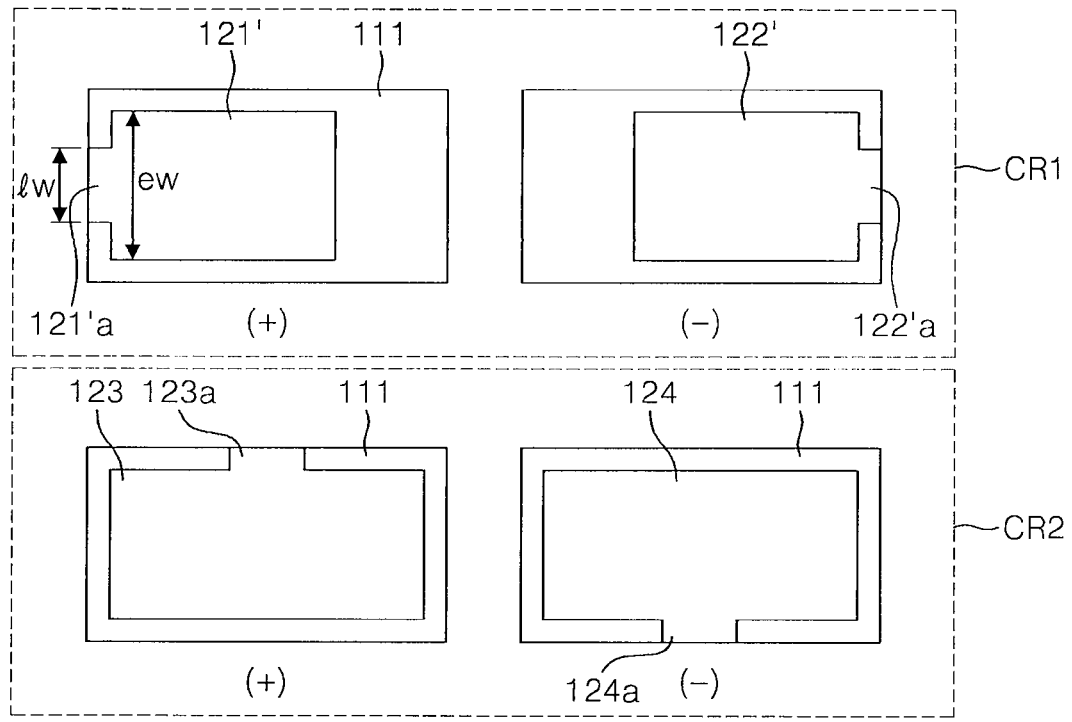
FIG. 9A is a plan view illustrating an inner electrode structure of a multilayer chip capacitor according to an exemplary embodiment of the invention.
Figure 10:
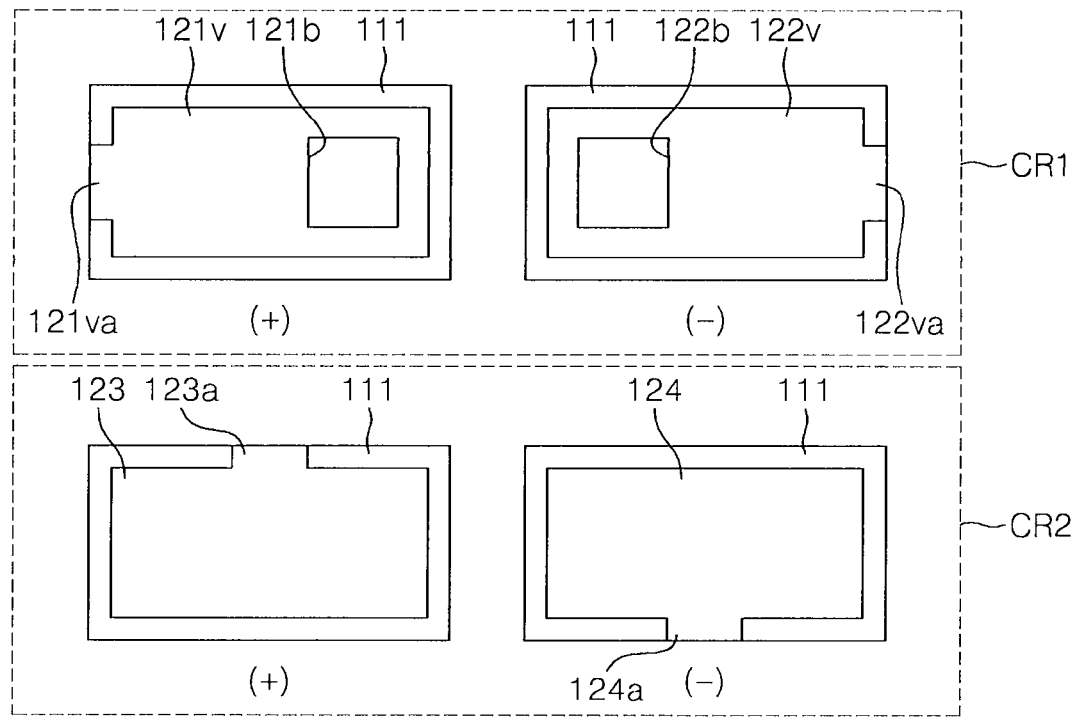
FIG. 10 is a plan view illustrating an inner electrode structure according to another embodiment of the invention.
Figure 11:
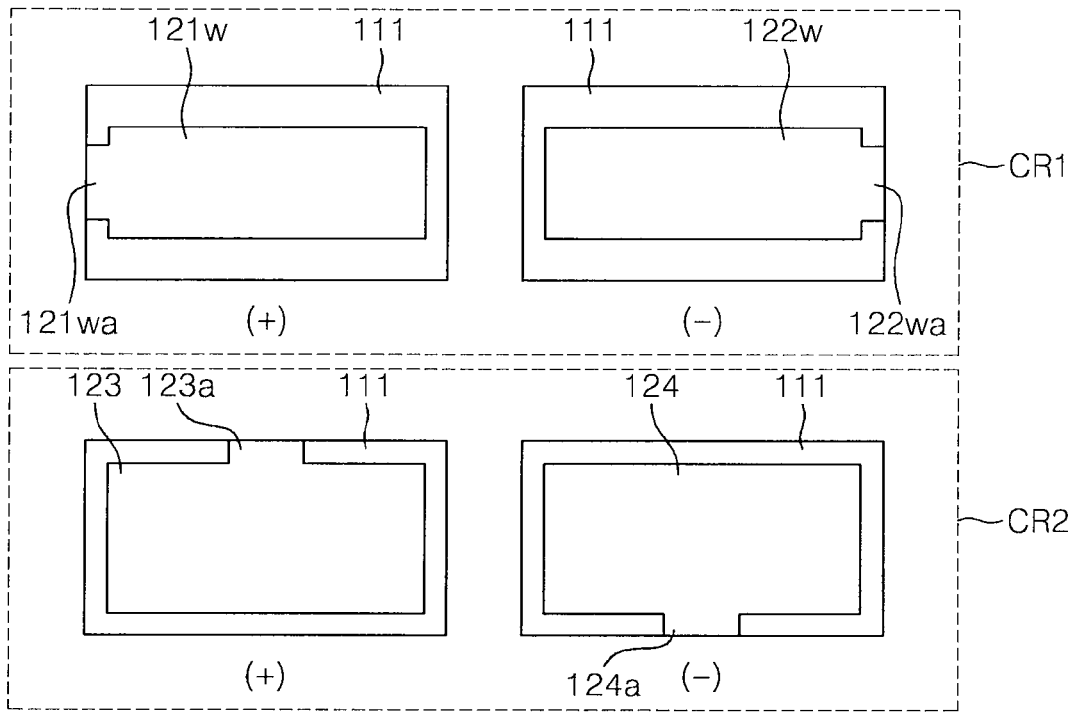
FIG. 11 is a plan view illustrating an inner electrode structure according to still another embodiment of the invention.

To reduce capacitance C1 of the first capacitor CR1, an inner electrode structure shown in FIG. 9A, 10, or 11 may be employed. The capacitor having the inner electrode structure of FIG. 9A, 10 or 11 may be shaped identically to FIG. 1 and have the inner lamination structure shown in FIG. 1.

FIG. 9A is a plan view illustrating an inner electrode structure of a multilayer chip structure according to an exemplary embodiment of the invention. The capacitor of FIG. 9A is configured in a way that the inner electrodes 121 and 122 of the capacitor of FIGS. 1 to 3 are substituted by the first and second inner electrodes 121' and 122'.

Referring to FIG. 9A, lengths of first and second inner electrodes 121' and 122' of a first capacitor unit CR1, i.e., length of longer side surfaces are relatively decreased. In this fashion, the lengths of the first and second inner electrodes 121' and 122' are made smaller than the lengths of the third and fourth electrodes 123 and 124. This reduces an overlapping area between the first inner electrode 121' and the second inner electrode 122' and accordingly, decreases capacitance C1 of the first capacitor unit CR1. Therefore, when the condition $$R_1 = R_2' = \sqrt{\frac{L_2'}{C_1}}$$

is satisfied, impedance of the connecting conductor lines required for maintaining flat impedance characteristics in a wide band frequency can be reduced. In the end, this easily allows for high ESR characteristics and flat impedance characteristics at a wide band without excessively prolonging the length of the connecting conductor lines 141 and 142.

Figure 9B:
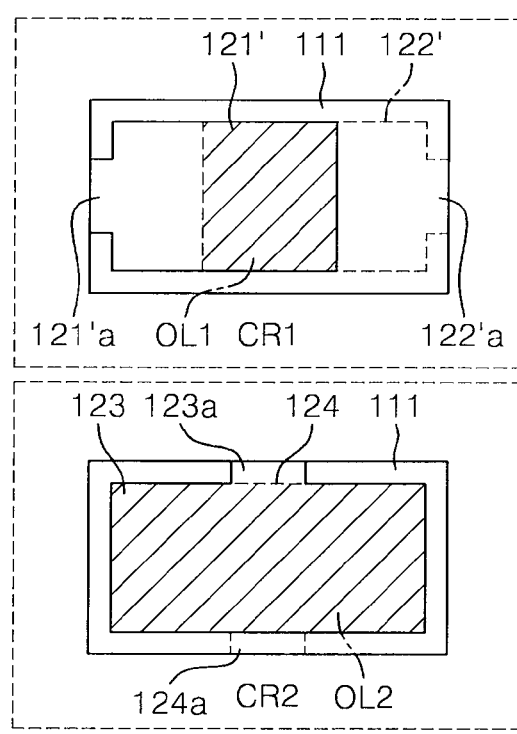
FIG. 9B is a view illustrating an overlapping area of adjacent inner electrodes of different polarities in first and second capacitor units shown in FIG. 9A.

FIG. 9B illustrates overlapping areas, i.e., the oblique line portions of adjacent inner electrodes of different polarities in a first capacitor unit CR1 and a second capacitor unit CR2 when the inner electrodes of FIG. 9A are laminated. As shown in FIG. 9B, the first and second inner electrodes 121' and 122' are decreased in length to reduce an overlapping area OL1 between the first and second inner electrodes 121' and 122' with different polarities, and accordingly capacitance of the first capacitor unit CR1. The overlapping area OL1 between the first and second inner electrodes 121' and 122' is smaller than an overlapping area OL2 between third and fourth inner electrodes 123 and 124. As described above, this smaller capacitance of the first capacitor unit CR1 serves to easily attain high ESR and flat impedance characteristics as well. In FIG. 9B, reference numerals 121'a and 122'a denote leads of the first and second inner electrodes 121' and 122', respectively.

FIG. 10 illustrates an inner electrode structure for decreasing capacitance of a first capacitor unit CR1 according to another exemplary embodiment of the invention. As shown in FIG. 10, openings or voids 121b and 122b are formed in first and second inner electrodes 121v and 122v of the capacitor unit CR1. This reduces an overlapping area of the first and second inner electrodes 121v and 122v and accordingly capacitance of the first capacitor unit CR1. In FIG. 10, reference numerals 121va and 122va denote leads of the first and second inner electrodes 121v and 122v, respectively.

FIG. 11 illustrates an inner electrode structure for reducing capacitance of a first capacitor unit CR1 according to still another exemplary embodiment of the invention. As shown in FIG. 11, widths of first and second inner electrodes 121w and 122w of the first capacitor unit CR1, i.e., lengths of shorter side surfaces is reduced. This reduces an overlapping area between the first and second inner electrodes 121w and 122w and accordingly capacitance of the first capacitor unit CR1. In FIG. 11, reference numerals 121wa and 122wa denote leads of the first and second inner electrodes 121w and 122w, respectively. As an alternative way to reduce capacitance of the first capacitor unit CR1, a dielectric layer between the opposing first and second inner electrodes has a thickness greater than a thickness of opposing third and fourth inner electrodes.

As described above, a decrease in capacitance of the first capacitor unit CR1 does not substantially prevent capacitance of the entire multilayer chip capacitor from being attained. As described above, this is because the capacitance of the entire multilayer chip capacitor is mostly attained by the second capacitor unit CR1.

Figure 12:
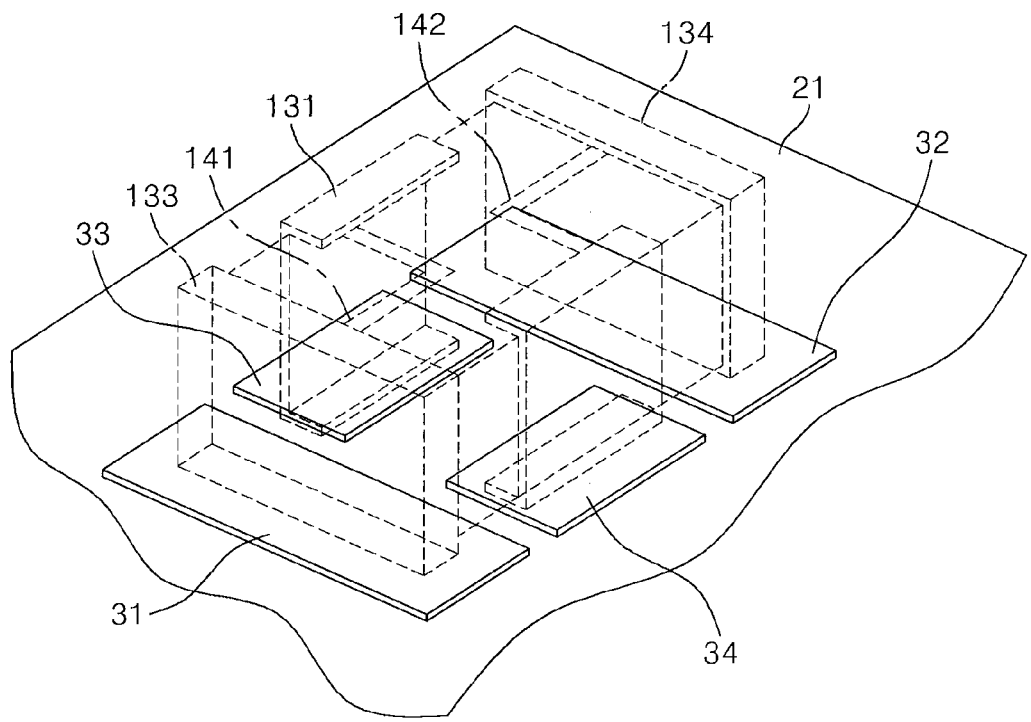
FIG. 12 is a perspective view illustrating a modified example of the circuit board apparatus shown in FIG. 4.
Figure 13:
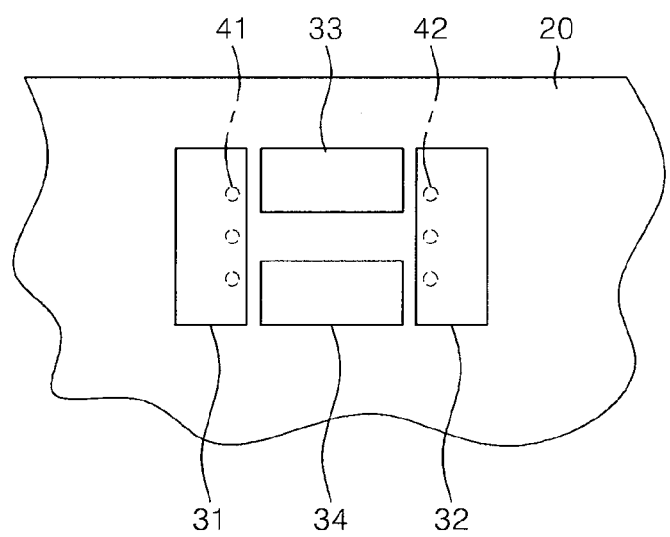
FIG. 13 is a plan view illustrating a circuit board shown in FIG. 12.

FIG. 12 is a perspective view illustrating a modified example of the circuit board apparatus shown in FIG. 4. The circuit board apparatus of FIG. 12 employs a circuit board 21 of FIG. 13 to mount the aforesaid capacitor 100 thereon, in place of the circuit board 20 of FIG. 7. Referring to FIGS. 12 and 13, the circuit board 21 further includes third and fourth pads 33 and 34 in addition to first and second pads 31 and 32 in a mounting area of the capacitor. The third and fourth pads 33 and 34 may be connected to the third and fourth outer electrodes 133 and 134 of the capacitor 100, respectively. However, unlike the first and second pads 31 and 32, the third and fourth pads 33 and 34 are not directly connected to outer circuits, for example, vias but electrically floated. Therefore, first and second outer electrodes 131 and 132 of the multilayer chip capacitor 100 are directly connected to the outer circuits, for example, vias 41 and 42 through the first and second pads 31 and 32, respectively. However, the third and fourth outer electrodes 133 and 134 are a kind of floating electrodes and connected to the outer circuits through first and second connecting conductor lines 141 and 142.

Alternatively, to mount the capacitor 100, the circuit board may include only one of the third pad 33 and the fourth pad 34, in addition to the first and second pads 31 and 32.

Figure 14:
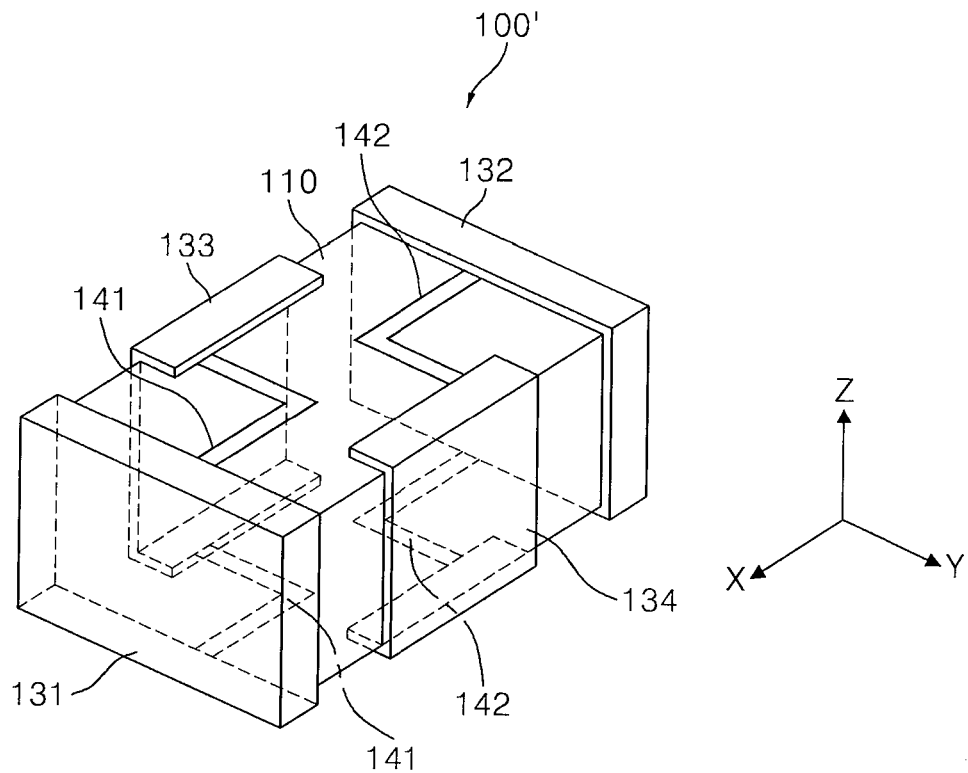
FIG. 14 is a perspective view illustrating a modified example of the capacitor shown in FIG. 14.
Figure 15:
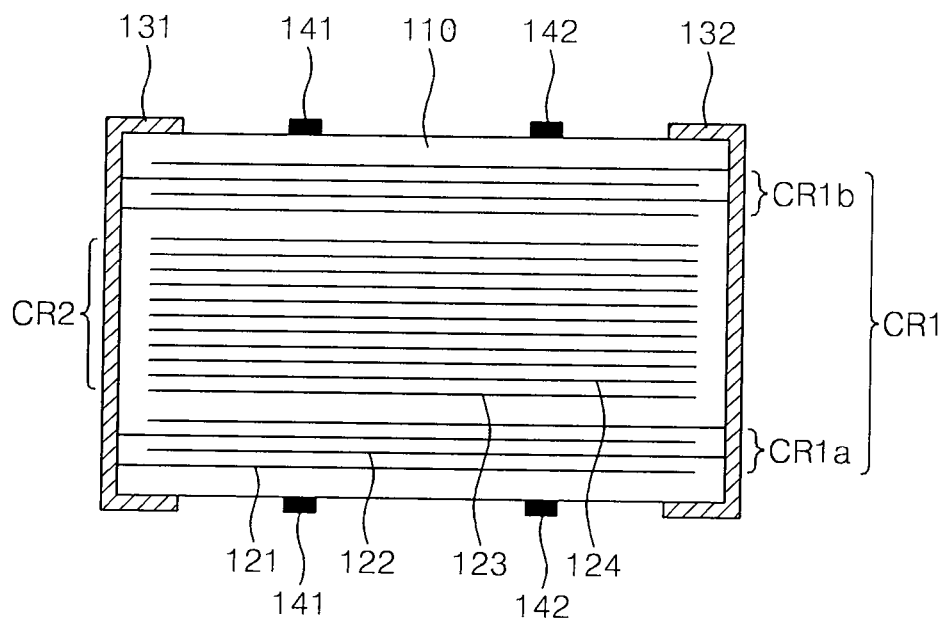
FIG. 15 is a cross-sectional view illustrating the capacitor shown in FIG. 14.

FIG. 14 is a perspective view illustrating a modified example of the capacitor shown in FIG. 14. FIG. 15 is a cross-sectional view illustrating the capacitor of FIG. 15. The capacitor 100' of FIG. 14 has inner and outer structures horizontally symmetrical.

Referring to FIGS. 14 and 15, the capacitor 100' has first and second connecting conductor lines 141 and 142 formed on a top and bottom of a capacitor body 110 and inner, and has the inner and outer structures horizontally symmetrical. As shown in FIG. 15, the first capacitor unit CR1 is divided into a lower portion CR1a and an upper portion CR1b and the lower and upper portions are disposed on both ends, i.e., in lower and upper parts in a laminated direction, i.e., in a Z axis direction. The second capacitor unit CR2 is disposed between the lower portion CR1a and the upper portion CR1b of the first capacitor unit. The first capacitor unit CR1 and the second capacitor unit CR2 are connected in parallel to each other by outer electrodes 131 to 134 and the connecting conductor lines 141 and 142.

The capacitor 100' is configured such that the lower and upper portions CR1a and CR1b of the first capacitor unit are arranged symmetrically and connecting electrode lines 141 and 142 formed on a top and bottom of the body are symmetrical with respect to each other. This allows the entire capacitor to be horizontally symmetrical. By virtue of this horizontal symmetry, the top and bottom of the capacitor do not need to be distinguished when the capacitor is mounted and accordingly, the capacitor can be conveniently mounted without the need to distinguish the top from the bottom. Referring to FIG. 14, connection configuration between the capacitor units CR1 and CR2 and the connecting conductor lines 141 and 142 is shown as in FIG. 6. Here, the circuit board of FIG. 7 or 13 may be employed to mount the capacitor thereon. Therefore, in the present embodiment, the connecting conductor lines allow series resistance to be added to the second capacitor unit CR2, and when the $$R_1 = R_2' = \sqrt{\frac{L_2'}{C_1}}$$

condition is satisfied, flat impedance characteristics can be obtained in a wide band frequency.

Figure 16:
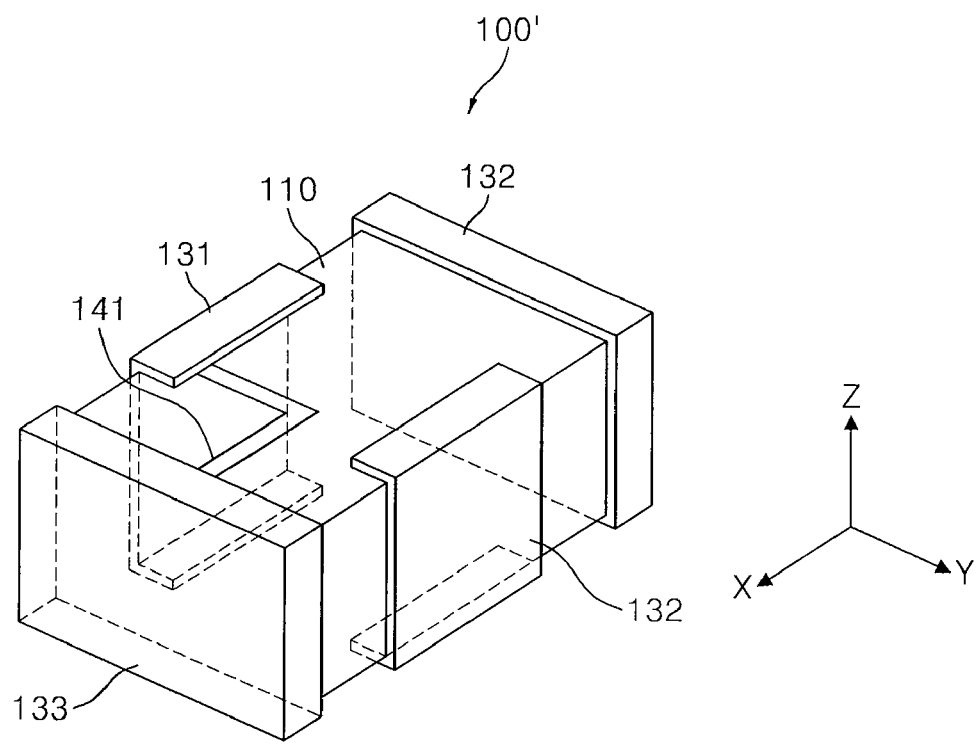
FIG. 16 is a perspective view illustrating another modified example of the multilayer chip capacitor shown in FIG.
Figure 17:
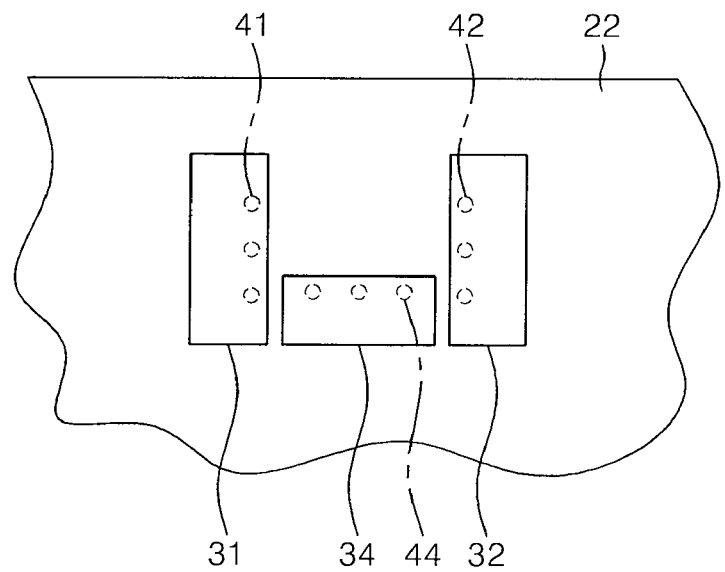
FIG. 17 is a plan view illustrating a circuit board for mounting the capacitor of FIG. 16 thereon according to an exemplary embodiment of the invention.
Figure 18:
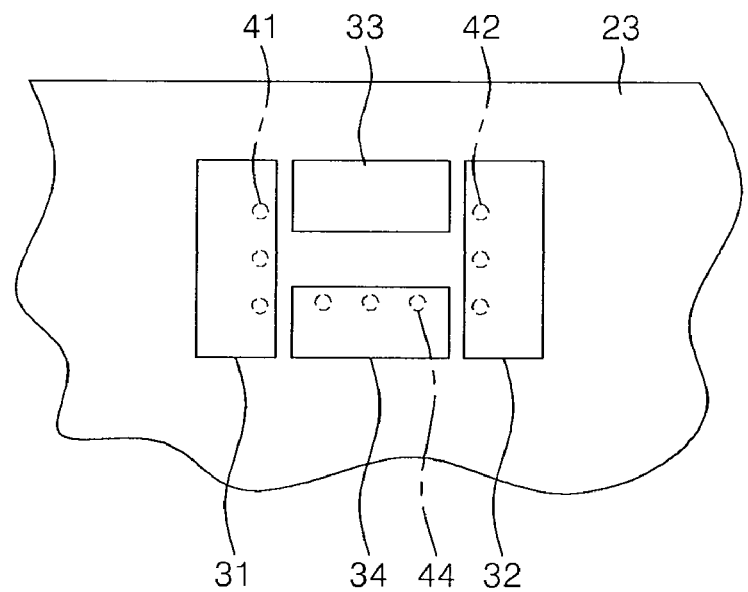
FIG. 18 is a plan view illustrating a circuit board for mounting the capacitor of FIG. 16 thereon according to another exemplary embodiment of the invention.
Figure 19:
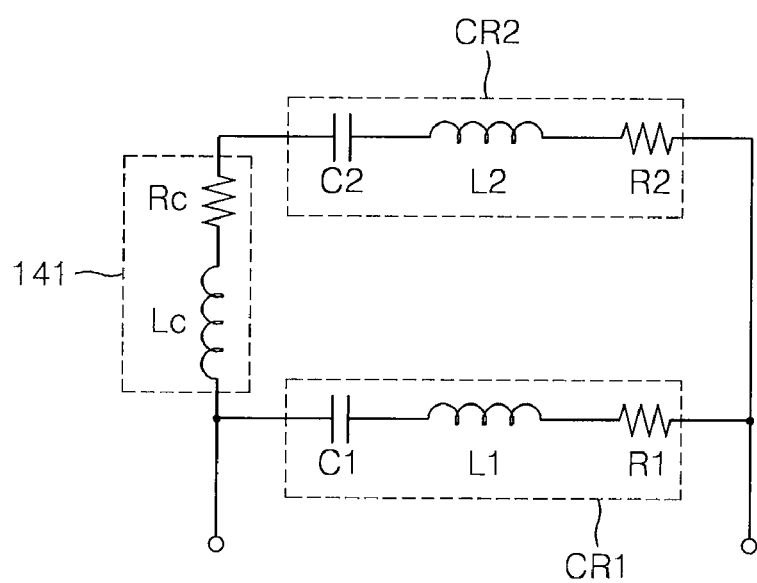
FIG. 19 is an equivalent circuit diagram illustrating the multilayer chip capacitor of FIG. 16 mounted on a circuit board.

FIG. 16 is a perspective view illustrating yet another modified example of the multilayer chip capacitor shown in FIG. 1. FIGS. 17 and 18 are plan views illustrating examples of a circuit board for mounting the capacitor of FIG. 16. FIG. 19 is an equivalent circuit diagram illustrating the multilayer chip capacitor of FIG. 16 mounted on a circuit board. The capacitor 100" of FIG. 16 has first and third outer electrodes 131 and 133 connected to each other by a connecting conductor line 141 but second and fourth outer electrodes 132 and 134 not connected to each other by a connecting conductor line. That is, the capacitor 100" of FIG. 16 is construed as the capacitor 100 of FIG. 1 which however does not employ the second connecting conductor line 142. A capacitor body of the capacitor 100" has an inner structure horizontally symmetrical in the same manner as the embodiment of FIG. 2. Alternatively, the connecting conductor line 141 may be additionally formed on a bottom of the capacitor body 110 and the capacitor body may have an inner structure configured in horizontal symmetry in the same manner as the embodiment of FIG. 15.

A circuit board of FIG. 17 may be adopted to mount this capacitor 100" thereon. As shown in FIG. 17, a circuit board 22 further includes first and second pads 31 and 32 connected to first and second outer electrodes 131 and 132, respectively and a pad 34 connected to a fourth outer electrode 134. Also, outer circuits such as vias 41, 42, and 44 are directly connected to the pads 31, 32, and 34, respectively.

As described above, the outer circuits, i.e., vias are connected to the pads 31, 32, and 34, respectively, thus allowing the first and second outer electrodes 131 and 132 to be directly connected to the outer circuits through the first and second pads 31 and 32, and the fourth outer electrode 134 to be directly connected to the outer circuit through the pad 34. Meanwhile, the third outer electrode 133 is connected to the outer circuit through the connecting conductor line 141.

As shown in FIG. 18, to mount the capacitor 100" of FIG. 16, a circuit board 23 including a floating additional pad 33 may be adopted. Referring to FIG. 18, the circuit board further includes a third pad 33 in addition to first, second and fourth pads 31, 32 and 34 connected to first, second and fourth outer electrodes 131, 132, and 134, respectively. This third pad 33 is not directly connected to an outer circuit, for example, via but connected thereto through a third outer electrode 133 and a connecting conductor line 141.

Referring to FIG. 19, in the capacitor 100" mounted on the circuit board 22 or 23, series resistance Rc by the connecting conductor line 141 is added to the second capacitor unit CR2. Here, in the Equation 1 is changed such that L2'=L2+Lc and R2'=R2+Rc. Also, the connecting conductor line and the second capacitor unit CR2 connected in series are connected in parallel to the first capacitor unit CR1. Moreover, the outer circuits are directly connected to the first, second and fourth pads 31, 32, and 34 so that not only both ends of the first capacitor unit CR1 but also one end of the second capacitor unit CR2 are led out to the outer circuit.

Figure 20:
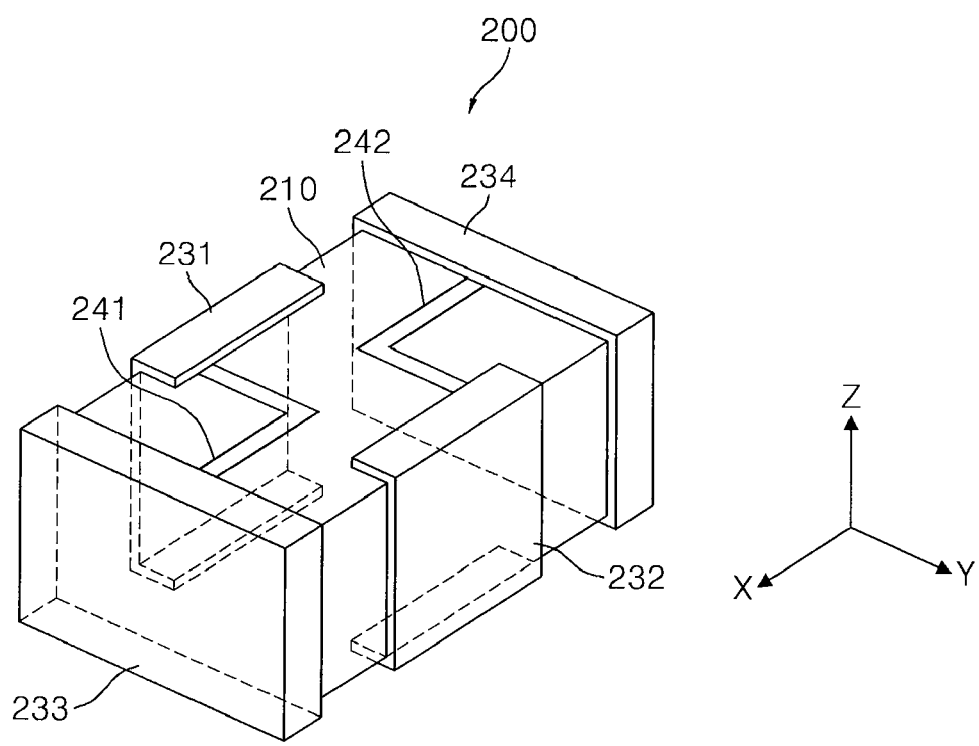
FIG. 20 is a perspective view illustrating a multilayer chip capacitor according to an exemplary embodiment of the invention.
Figure 21:
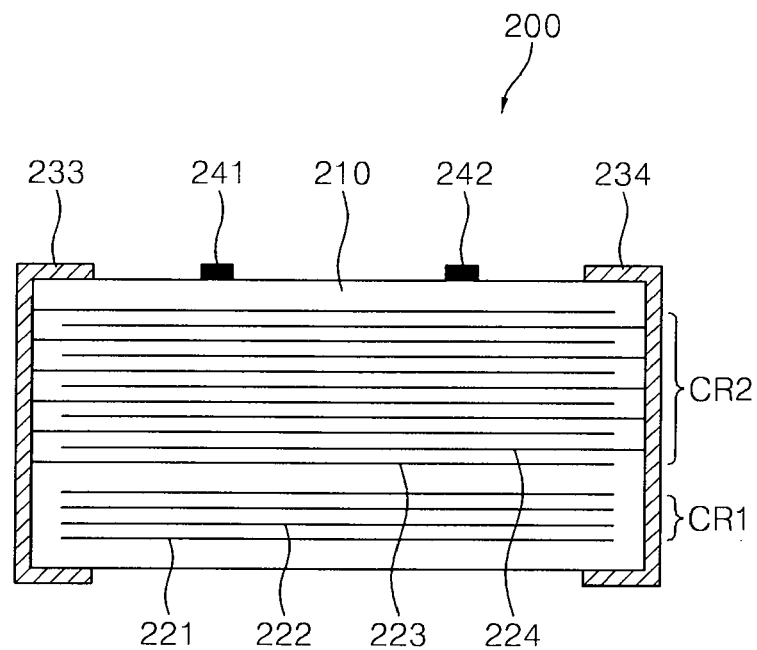
FIG. 21 is a cross-sectional view illustrating a multilayer chip capacitor according to another exemplary embodiment of the invention.
Figure 22:
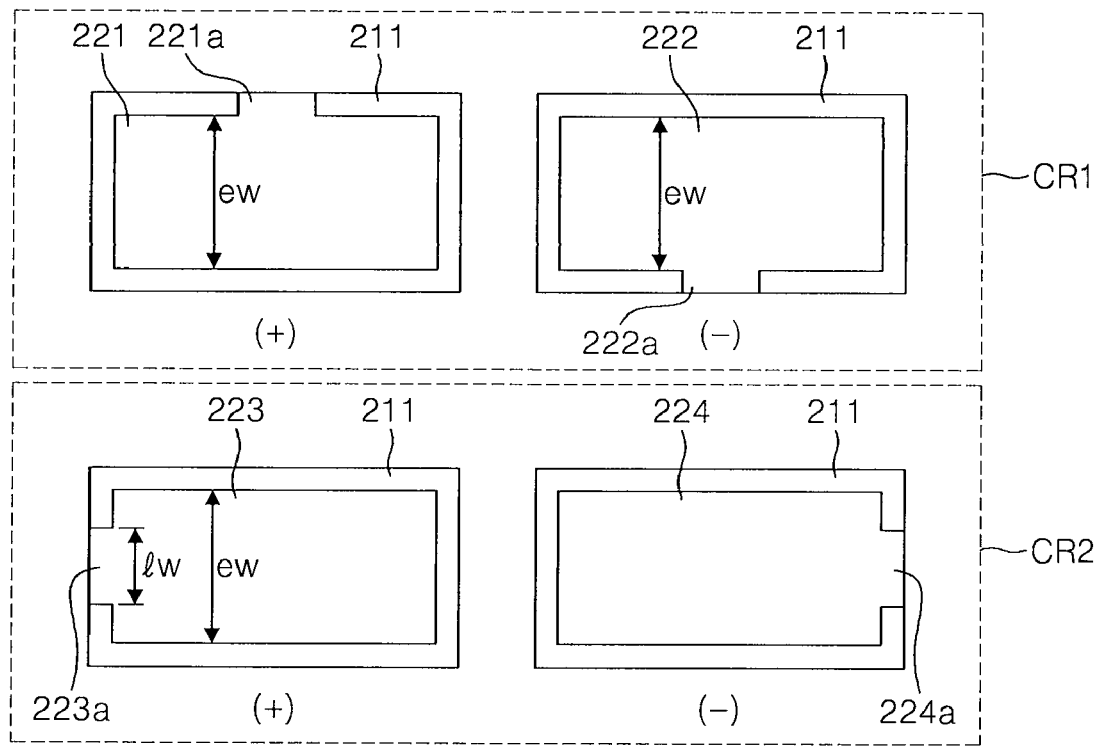
FIG. 22 is a plan view illustrating an inner electrodes structure according to yet another exemplary embodiment of the invention.

FIG. 20 is a perspective view illustrating a multilayer chip capacitor according to an exemplary embodiment of the invention. FIG. 21 is a cross-sectional view illustrating a multilayer chip capacitor according to another exemplary embodiment of the invention. FIG. 22 is a plan view illustrating an inner electrode structure illustrating a multilayer chip capacitor according to yet another exemplary embodiment of the invention.

Unlike the previous embodiments, in the capacitor 200 of FIGS. 20 to 22, first and second outer electrodes 231 and 232 of a first capacitor unit CR1 disposed in a lower part of a capacitor body 210 are formed on two longer side surfaces of the capacitor body 210 and third and fourth outer electrodes 233 and 234 of a second capacitor unit CR2 disposed in an upper part of the first capacitor unit CR1 are formed on two shorter side surfaces of the capacitor body 210. Also in the present embodiment, the first and second capacitor units CR1 and CR2 have capacitances C1 and C2 and ESRs R1 and R2 defined by C1<C2, R1>R2 and also the condition $$R_1 = R'_2 = \sqrt{\frac{L'_2}{C_1}}$$

is satisfied.

As shown in FIGS. 20 and 22, first and second inner electrodes 221 and 222 of the first capacitor unit CR1 are connected to the first and second outer electrodes 231 and 232 through leads 221a and 222a, respectively. Third and fourth inner electrodes 223 and 224 of the second capacitor unit CR2 are connected to third and fourth outer electrodes 233 and 234 through leads 223a and 224a, respectively. In the present embodiment, the leads 221a to 224a can be adjusted in width to control an ESR of a corresponding one of the capacitor units. Optionally, the leads may have widths expanded to entire lengths of longer side surfaces or shorter side surfaces of a main part of the inner electrodes. Reference numeral 211 denotes a dielectric layer.

As shown in FIG. 20, a distance between the first and second outer electrodes 231 and 232 is shorter than a distance between the third and fourth outer electrodes 233 and 234. Accordingly, a current path in the first and second inner electrodes 221 and 222 has a length shorter than a length of a current path in the third and fourth inner electrodes 223 and 224. Therefore, the first capacitor unit CR1 may have a lower ESL than the second capacitor unit CR2 (L1<L2) to serve to reduce an ESL at a high frequency. The first capacitor unit CR1 having an ESL lower than an ESL of the second capacitor unit CR2 is disposed adjacent to a mounting surface of the circuit board, thus further shortening a current path by a current loop and more reducing an ESL of the entire capacitor, particularly in a high frequency range. In the end, this ensures flat impedance characteristics and high ESR characteristics in a wide band frequency and allows an ESL to be maintained at a lower level at a high frequency band of the entire capacitor. The multilayer capacitor of the present embodiment beneficial for achieving low ESL can be effectively used as a decoupling capacitor for an MPU package.

Figure 23:
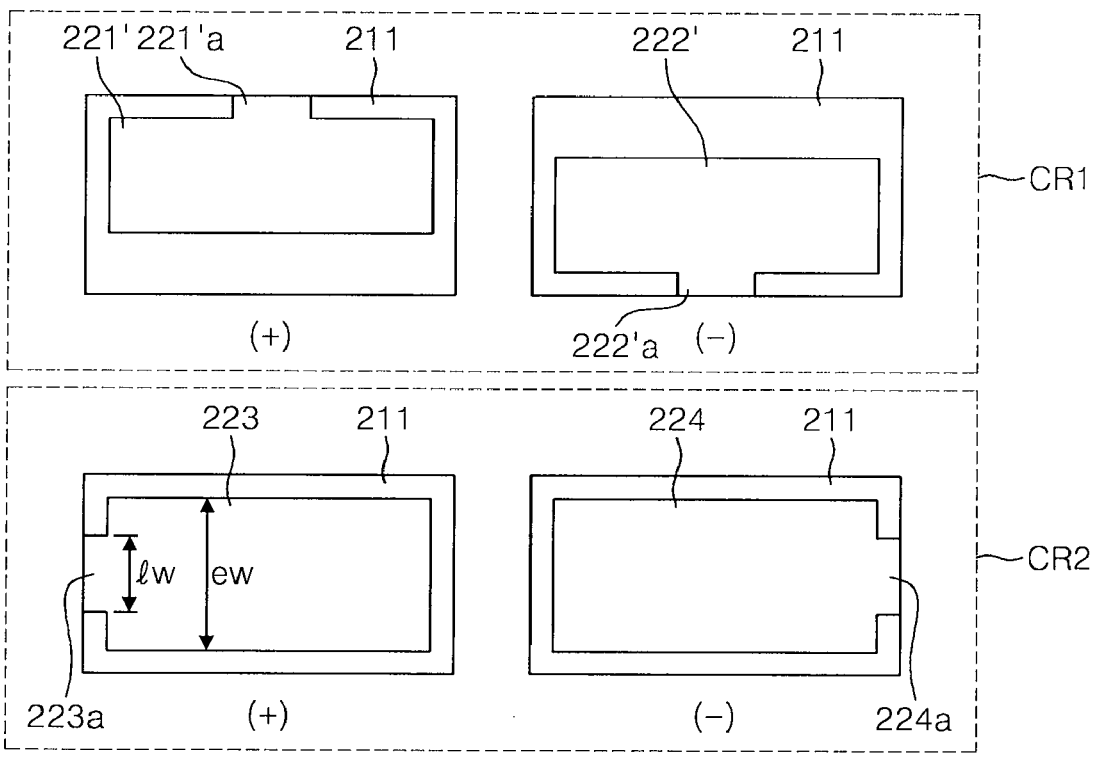
FIG. 23 is a plan view illustrating a modified example of the inner electrode structure shown in FIG. 22.
Figure 24:
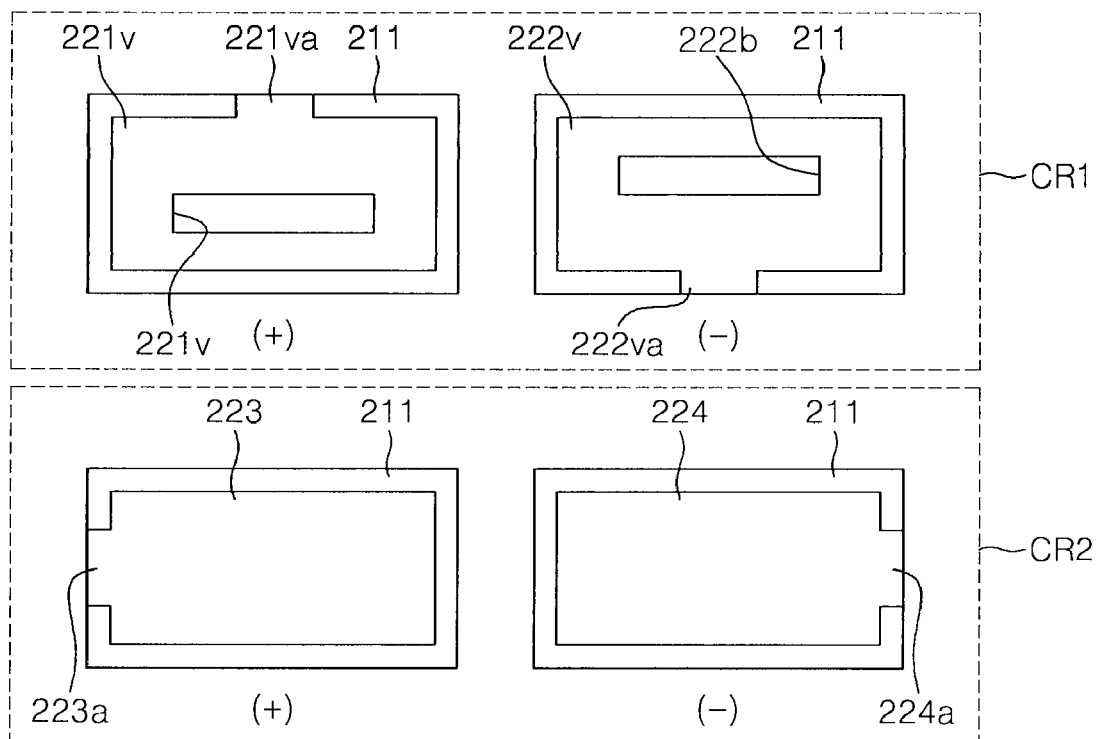
FIG. 24 is a plan view illustrating another modified example of the inner electrode structure shown in FIG. 23.
Figure 25:
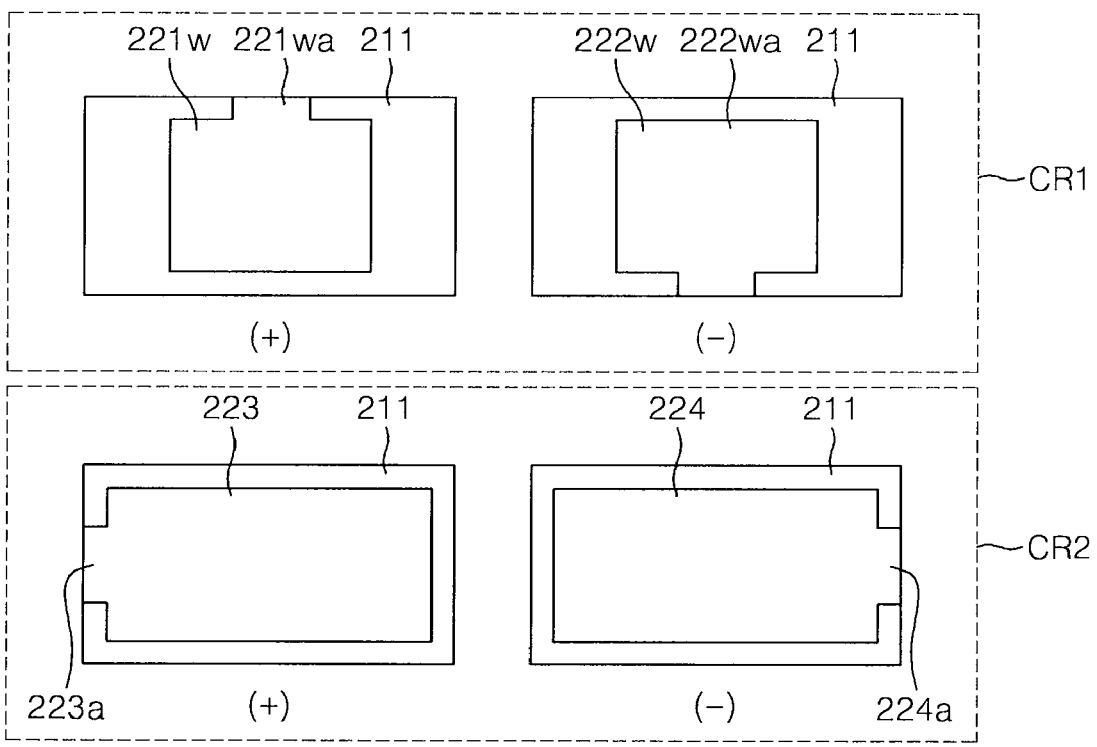
FIG. 25 is a plan view illustrating still another modified example of the inner electrode structure shown in FIG. 25.

The capacitor 200 of FIG. 20 may employ an inner electrode structure of FIG. 23, 24 or 25 to easily realize a higher ESL. That is, as shown in FIG. 23, first and second inner electrodes 221' and 222' of a first capacitor unit CR1 may have widths decreased. Here, the widths of the first and inner electrodes 221' and 222' are smaller than widths of third and fourth inner electrodes 223 and 224. Also, as shown in FIG. 24, openings 221b and 222b may be formed in first and second inner electrodes 221v and 222v of a first capacitor unit CR1. Moreover, as shown in FIG. 25, first and second inner electrodes 221w and 222w of a first capacitor unit CR1 may have a length decreased. Here, the lengths of the first and second inner electrodes 221w and 222w are smaller than lengths of third and fourth inner electrodes. As described above, when the adjacent inner electrodes of different polarities in the first capacitor unit CR1 have an overlapping area reduced, the first capacitor unit CR1 has capacitance C1 decreased to thereby ensure a high ESR and easily satisfy the condition $$R_1 = R'_2 = \sqrt{\frac{L'_2}{C_1}}.$$

A dielectric layer between the adjacent first and second inner electrodes may be increased in thickness to reduce capacitance C1 of the first capacitor unit CR1. Referring to FIGS. 23 to 25, reference numerals 221'a, 222'a, 221va, 222va, 221wa, and 222wa denote leads.

Figure 26:
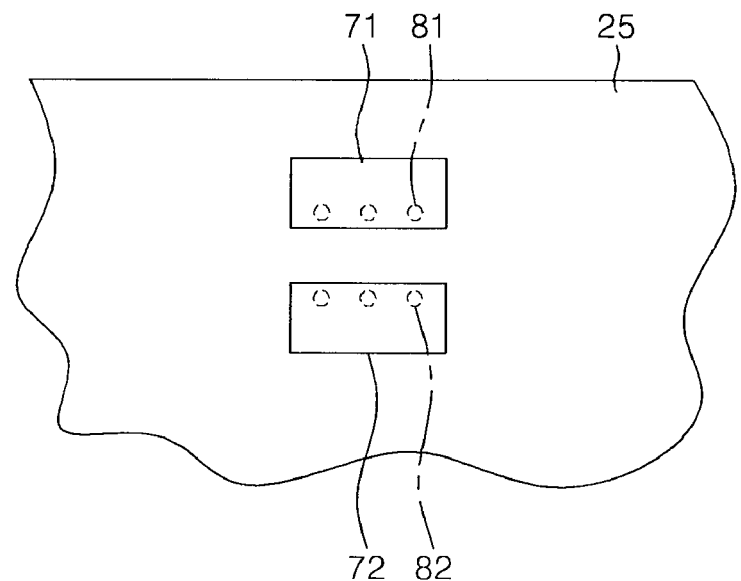
FIG. 26 is a plan view illustrating a circuit board having the capacitor of FIG. 20 mounted thereon according to an exemplary embodiment of the invention.

FIG. 26 illustrates a circuit board having the capacitor 200 of FIG. 20 mounted thereon according to an exemplary embodiment of the invention. Referring to FIG. 26, the circuit board 25 includes first and second pads 71 and 72 having first and second outer electrodes 231 and 232 connected thereto, respectively and outer circuits, i.e., vias 81 and 83 are connected to the pads 71 and 72, respectively. Accordingly, this allows for the equivalent circuit as shown in FIG. 6 and assures series resistance to be added to the second capacitor unit CR2 by connecting conductor lines 241 and 242 or the second capacitor unit CR2 to be substantially adjusted in resistance (refer to Equation 1).

Figure 27:
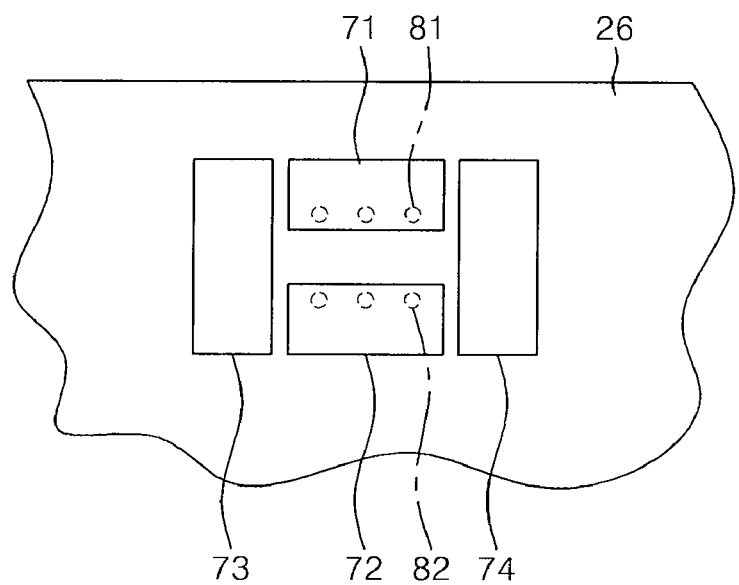
FIG. 27 is a plan view illustrating a circuit board having the capacitor of FIG. 20 mounted thereon according to another exemplary embodiment of the invention.

In order to mount the capacitor 200, the circuit board 26 of FIG. 27 may be employed in place of the circuit board 25 of FIG. 26. Floating additional pads 73 and 74 not directly connected to the outer circuits may be connected to the third and fourth outer electrodes 233 and 234, respectively.

Figure 28:
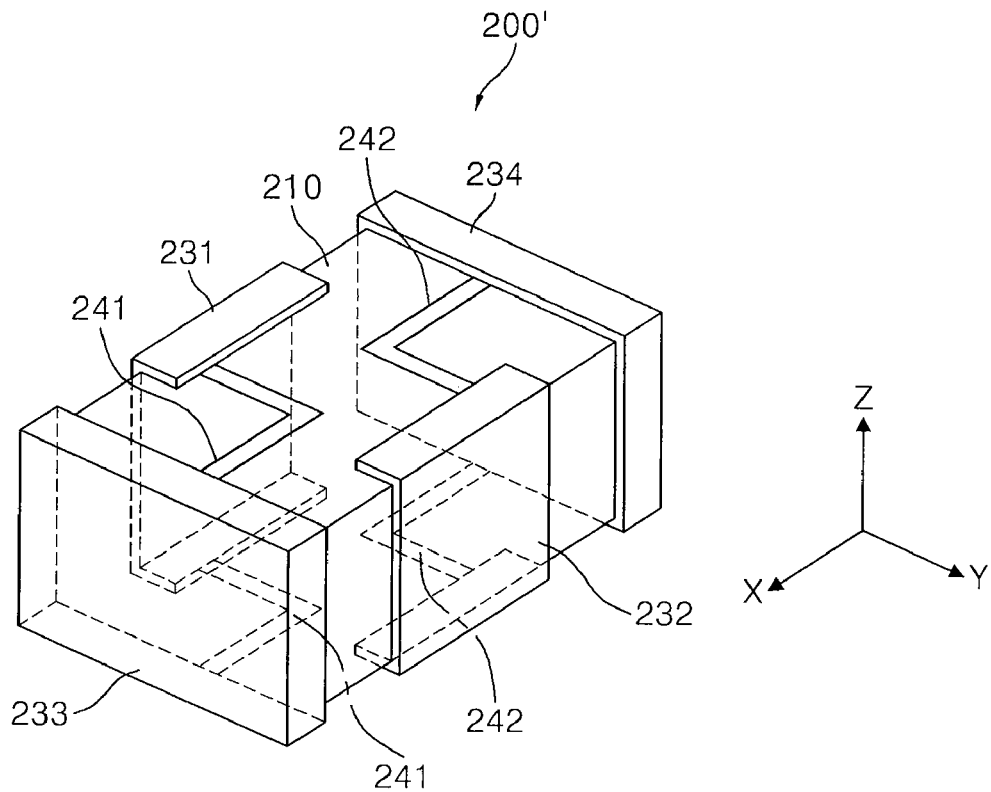
FIG. 28 is a perspective view illustrating a modified example of the capacitor shown in FIG. 20.
Figure 29:
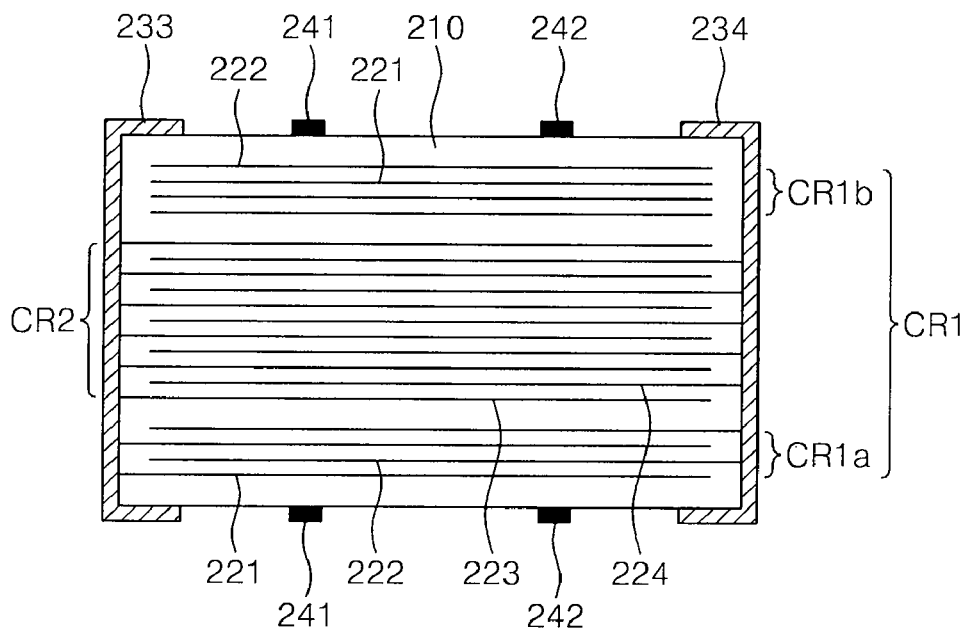
FIG. 29 is a cross-sectional view illustrating the capacitor shown in FIG. 28.

FIG. 28 is a perspective view illustrating a modified example of the capacitor of FIG. 20. FIG. 29 is a cross-sectional view illustrating the capacitor of FIG. 28. The capacitor 200' of FIGS. 28 and 29 is construed to correspond to the capacitor of FIG. 20 whose inner and outer structures however are configured in horizontal symmetry. That is, as shown in FIGS. 28 and 29, connecting conductor lines 241 and 242 are formed on a top and bottom of a capacitor body. Also, inside the body 210, a first capacitor unit CR1: CR1a, CR1b is divided into upper and lower portions to be formed in an upper and lower part of the body 210 and a second capacitor CR2 is disposed between the upper and lower portions of the first capacitor unit CR1. An inner electrode structure of the capacitor units CR1 and CR2 is identical to what has been described with reference to FIGS. 22 to 25.

Figure 30:
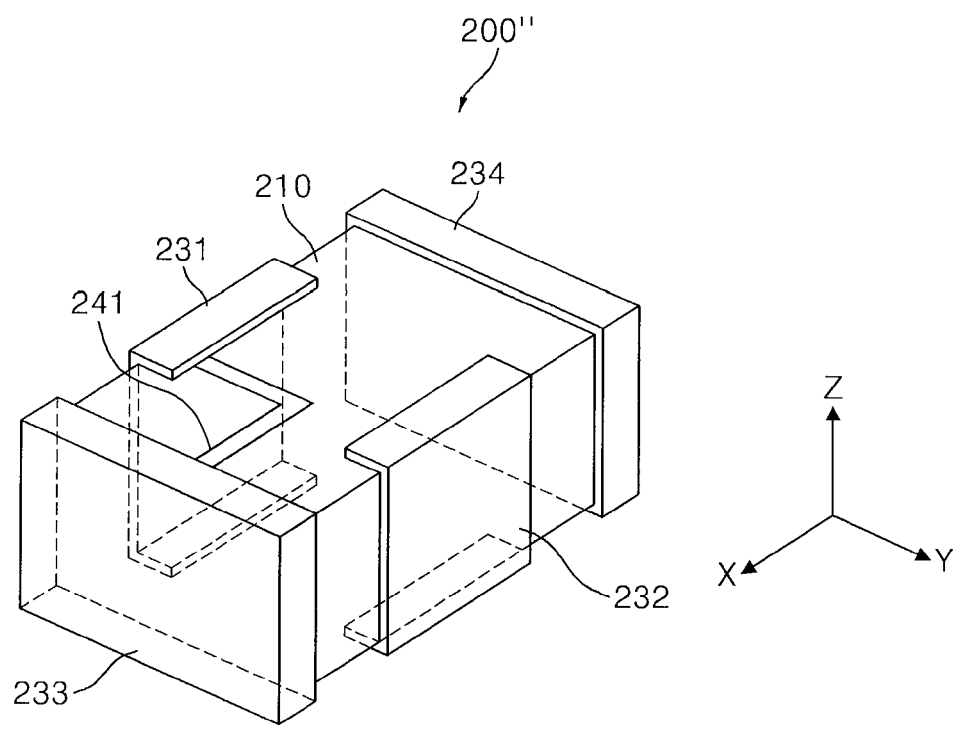
FIG. 30 is a perspective view illustrating another modified example of the capacitor shown in FIG. 20.
Figure 31:
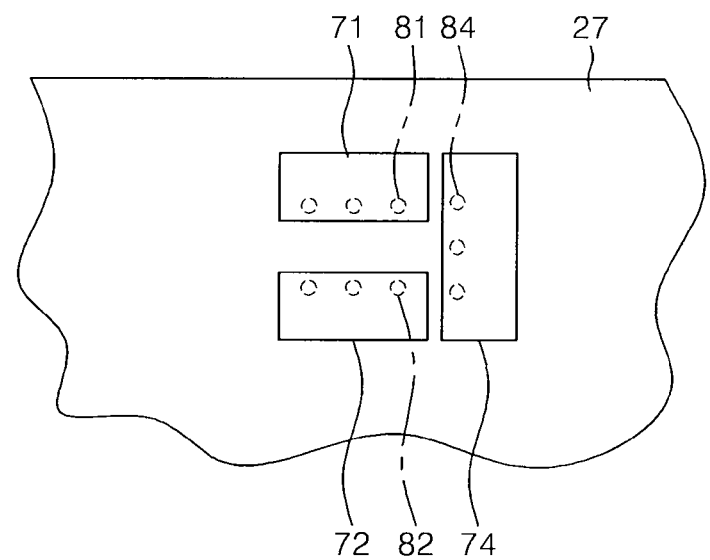
FIG. 31 is a plan view illustrating a circuit board having the capacitor of FIG. 30 mounted thereon according to still another exemplary embodiment of the invention.
Figure 32:
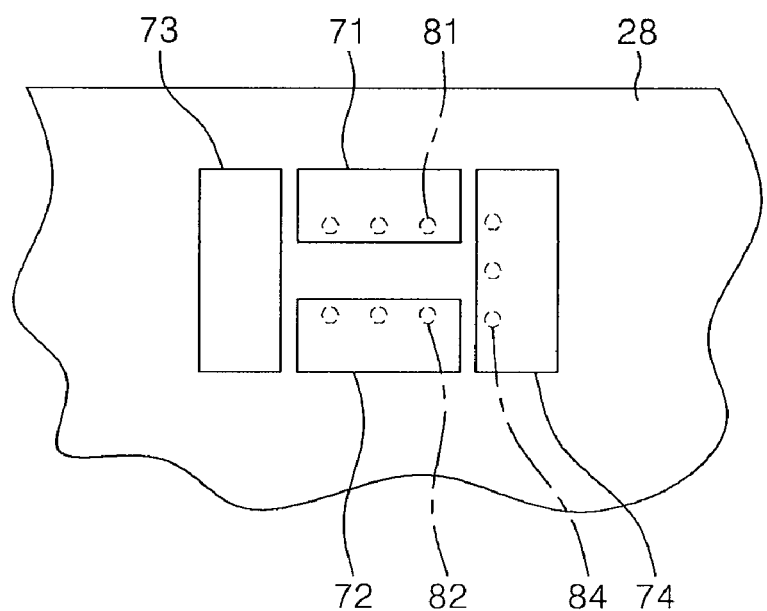
FIG. 32 is a plan view illustrating a circuit board having the capacitor of FIG. 30 mounted thereon according to yet another exemplary embodiment of the invention.

FIG. 30 is a perspective view illustrating another modified example of the capacitor of FIG. 20 and FIGS. 31 and 32 are plan views illustrating circuit boards having the capacitor of FIG. 30 mounted thereon according to an exemplary embodiment of the invention, respectively.

The capacitor 200" of FIG. 30 is construed as the capacitor 200 of FIG. 20 which however does not employ a connecting conductor line 242. In the same manner as described above, a first outer electrode 231 and a third outer electrode 233 are connected to each other by a connecting conductor line 241, but a second outer electrode 232 and a fourth outer electrode 234 may not be connected together by a connecting conductor line. In this case, as shown in FIG. 31, to mount the capacitor 200", a circuit board 27 including pads 71, 72, and 74 connected to the first, second and fourth outer electrodes, respectively may be employed. Outer circuits such as vias 81, 82, and 84 may be directly connected to the pads 71, 72, and 74, respectively.

Alternatively, to mount the capacitor 200", as shown in FIG. 32, a floating additional pad 73 may be further provided. However, the via is not directly connected to the pad 73. The circuit board 27 or 28 employed allows the first, second and fourth pads 71, 72, and 74, and accordingly first, second and fourth outer electrodes 231, 232, and 234 to be directly connected to the outer circuits such as vias but the third pad, and accordingly the third outer electrode 233 to be connected to the outer circuit by the connecting conductor line 241.

The capacitor 200" of FIG. 30 may have inner and outer structures configured in horizontal symmetry by additionally forming the conductor line 241 on a bottom thereof to have an inner structure as shown in FIG. 29.

Figure 33:
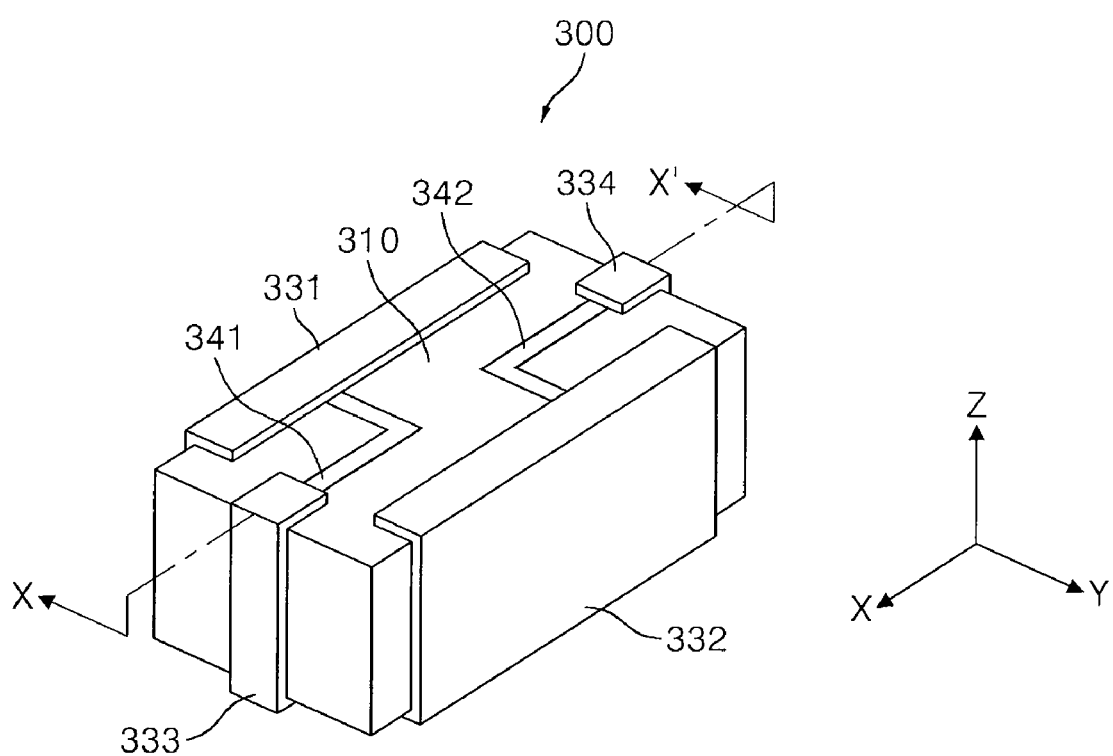
FIG. 33 is a perspective view illustrating a multilayer chip capacitor according to another exemplary embodiment of the invention.
Figure 34:
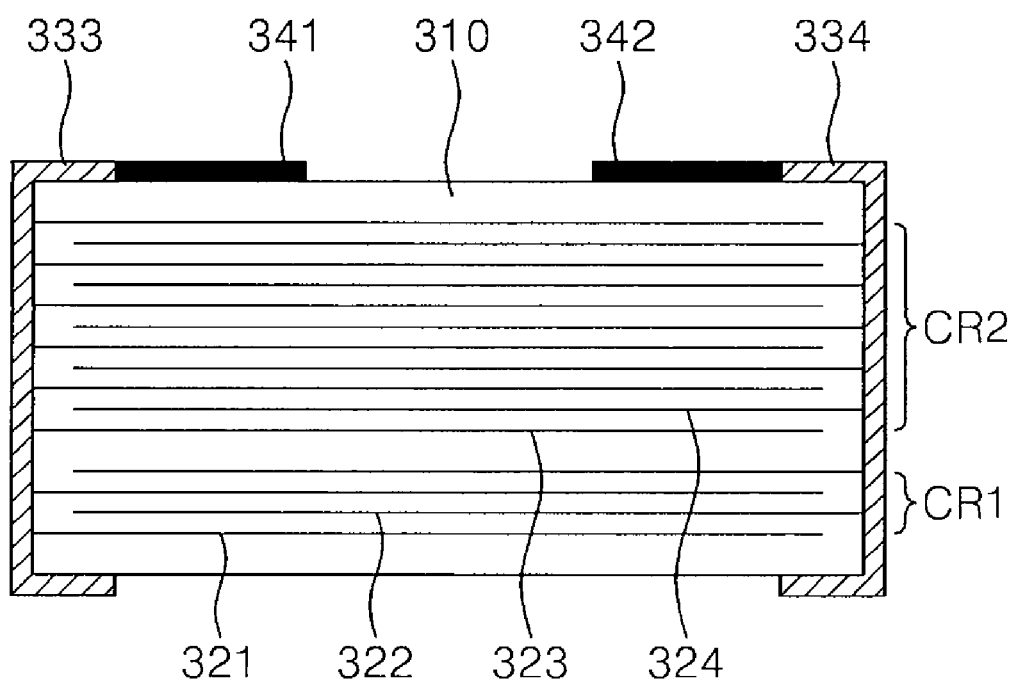
FIG. 34 is a cross-sectional view illustrating the capacitor of FIG. 33 taken along the line XX'.
Figures 35A, 35B:
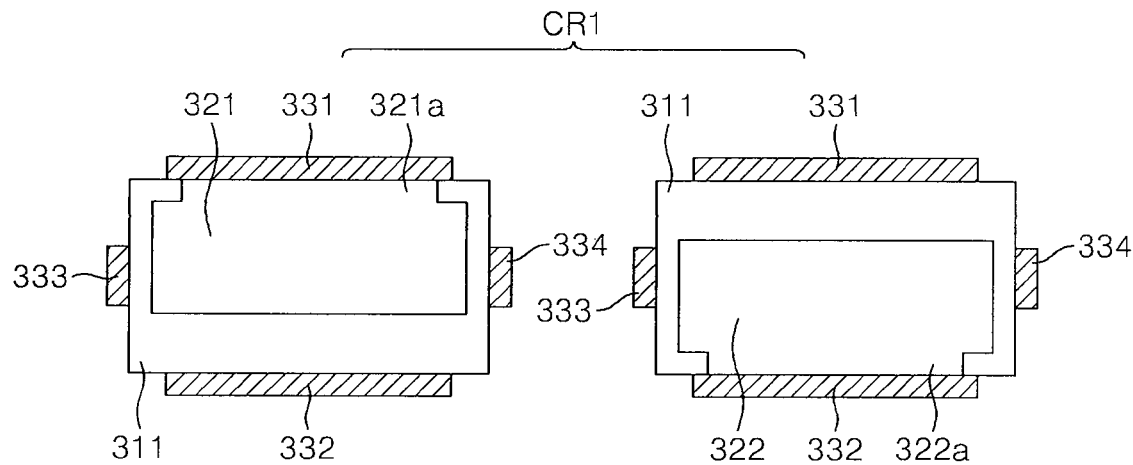
FIGS. 35A to 35D is a plan view illustrating an inner electrode structure according to yet another exemplary embodiment of the invention.
Figures 35C, 35D:
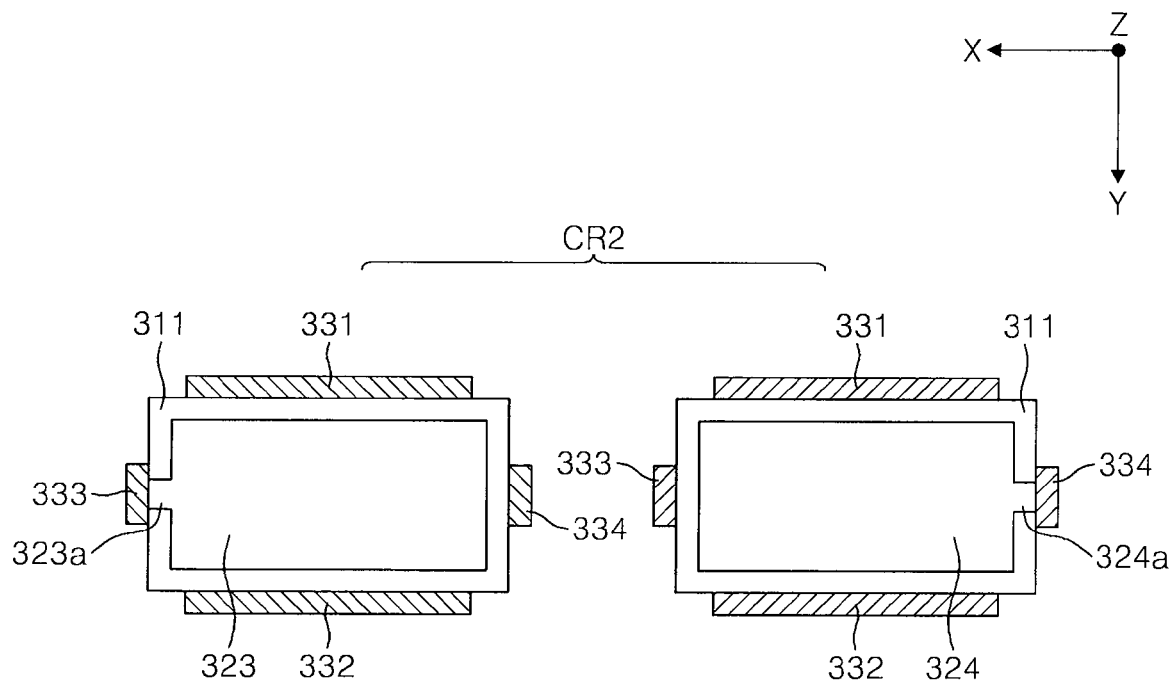

FIG. 33 is a perspective view illustrating a multilayer chip capacitor according to an exemplary embodiment of the invention. FIG. 34 is a cross-sectional view illustrating the capacitor of FIG. 33 taken along the line XX'. FIG. 35 is a plan view illustrating an inner electrode structure according to yet another exemplary embodiment of the invention.

In the capacitor 300 of FIGS. 33 to 35, first and second outer electrodes 331 and 332 are formed mostly across longer side surfaces of a capacitor body 310 to cover the longer side surfaces. Third and fourth outer electrodes 333 and 334 cover a portion of lengths of shorter side surfaces of the capacitor body 310. When it comes to an inner structure of the capacitor, as shown in FIGS. 34 and 35, first and second inner electrodes 321 and 322 of a first capacitor unit CR1 in a lower part are connected in contact with the first and second outer electrodes 331 and 332 through leads 321a and 322a, respectively. Third and fourth inner electrodes 323 and 324 of a second capacitor unit CR2 in an upper part are connected in contact with the third and fourth electrodes 333 and 334 through leads 333a and 334a, respectively.

In the embodiment of FIGS. 33 to 35, the first and second outer electrodes 331 and 332 are arranged on the longer side surfaces of the capacitor body and the widths of the leads 321a and 321b of the first and second inner electrodes are elongated to cover most of the length of the longer side surfaces. This leads to a very low ESL of particularly, the first capacitor unit CR1. The low ESL of the first capacitor unit CR1 located adjacent to the mounting surface of the circuit board serves to further reduce an ESL of the entire chip capacitor. Optionally, the leads 321a and 322a of the first and second inner electrodes may have widths expanded to entire lengths of the longer side surfaces of a main part of the first and second inner electrodes 321 and 322. Referring to FIG. 35, the first and second inner electrodes 321 and 322 have widths decreased but the present invention is not limited thereto. For example, the first and second inner electrodes 321 and 322 may have widths identical to widths of the third and fourth inner electrodes 323 and 324. The first and second inner electrodes 321 and 322 may have lengths decreased or be provided with openings.

Figure 36:
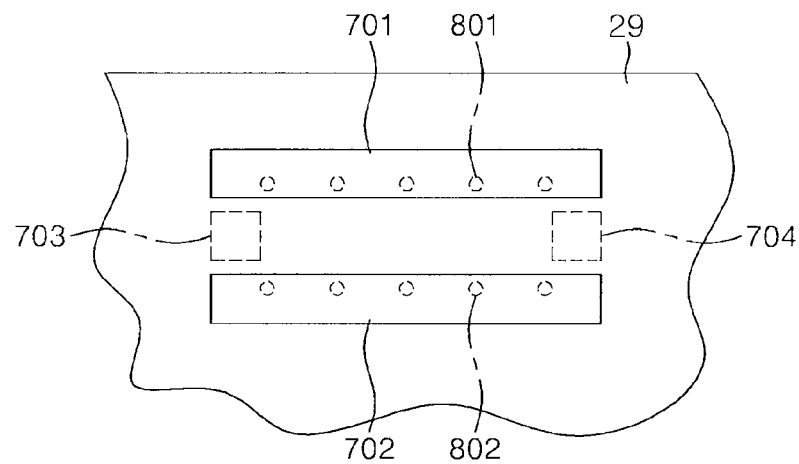
FIG. 36 is a plan view illustrating a circuit board having the capacitor of FIG. 33 mounted thereon according to a further exemplary embodiment of the invention.

To mount the capacitor 300 of FIG. 33, a circuit board 29 shown in FIG. 36 may be employed. Vias 801 and 802 are connected as outer circuits to first and second pads 701 and 702 connected to the first and second outer electrodes 331 and 332, respectively. At least one of additional floating third and fourth pads 703 and 704 may be further provided (see a dotted line).

Also in the embodiment of FIG. 33, a connecting conductor line 341 is formed on a bottom of the capacitor body and has an inner structure in horizontal symmetry. Accordingly this allows the capacitor to have inner and outer structures in horizontal symmetry.

EXAMPLE

Example 1

FIG. 37 is a graph illustrating comparison results of frequency vs. impedance (f-z) characteristics of Inventive Example 1 and Conventional Example. An impedance curve (solid line) of a capacitor of Inventive Example 1 plots measurement results of frequency vs. impedance of a sample having the capacitor and circuit board apparatus according to the embodiments of FIGS. 1 to 7.

Particularly, the sample of Inventive Example 1 is a four-terminal multilayer chip capacitor with capacitance of 10 µf and size of 1608 (1.6 mm×0.8 mm). The capacitor of Inventive Example 1 has an ESR of about 100 mΩ and satisfies the aforesaid condition $$R_1 = R'_2 = \sqrt{\frac{L'_2}{C_1}}.$$

A curve (dotted line) of frequency vs. impedance characteristics of Conventional Example plots measurement results for a two-terminal capacitor sample with capacitance of 10 µF. This sample of Conventional Example does not employ two divided capacitor units, but has inner electrodes of different polarities connected alternately to two outer electrodes.

As shown in FIG. 37, Inventive Example 1 exhibits a high ESR and flat impedance characteristics in a broad frequency range, i.e., substantially equivalent to a constant. Meanwhile, Conventional Example exhibits very low impedance near a resonance frequency, i.e., low ESR characteristics and very steep valley or local minimum at a resonance frequency. Therefore, the impedance characteristics of Inventive Example 1 ensure a significantly stable power distribution network over Conventional Example.

Example 2

FIG. 38 is a graph illustrating comparison results of frequency vs. impedance (f-z) characteristics of a multilayer chip capacitor according to Inventive Example 2 and Comparative Example. An impedance curve (solid line) of the capacitor of Inventive Example 2 plots measurement results of frequency vs. impedance for a sample having a capacitor of FIGS. 1 and 2, a circuit board of FIG. 7 and an inner electrode structure of one of FIGS. 9A to 11.

Particularly, the sample of Inventive Example 2 is a four-terminal multilayer chip capacitor with a capacitance of 10 μF and a size of 1608 (1.6 mm×0.8 mm), and satisfies the aforesaid condition $$R_1 = R'_2 = \sqrt{\frac{L'_2}{C_1}}.$$

The capacitor of Inventive Example 2 exhibits a very high ESR of 900 mΩ.

On the contrary, the sample of Comparative Example has a structure shown in FIGS. 1 to 4 and 7 and demonstrates a very high ESR of about 900 mΩ, but does not satisfy the condition $$R_1 = R'_2 = \sqrt{\frac{L'_2}{C_1}}.$$

In fact, in order to attain a very high ESR of 900 mΩ and satisfy the condition $$R_1 = R'_2 = \sqrt{\frac{L'_2}{C_1}}$$

as well, a connecting conductor line with an inductance of at least 10 nH was required.

As shown in FIG. 38, the sample (solid line) of Inventive Example 2 demonstrates a very high ESR of 900 mΩ while ensuring flat impedance characteristics in a broad band frequency. On the other hand, the sample (dotted line) of the Comparative Example does not exhibit flat impedance characteristics in a wide band frequency but shows valley impedance in a frequency range where a frequency relatively greatly influenced by the second capacitor unit intersects a frequency relatively greatly influenced by the first capacitor unit. In the end, in the sample of Comparative Example, lack or limit in inductance of the connecting conductor line increases an ESR and hinders the realization of flat impedance characteristics in a wide band frequency.

In the embodiments described above, the connecting conductor lines 141, 142, 241, 242, 341, and 342 satisfying the condition $$R_1 = R'_2 = \sqrt{\frac{L'_2}{C_1}}$$

are formed on an outer surface of the capacitor body but the present invention is not limited thereto (refer to the embodiment below).

Figure 39:
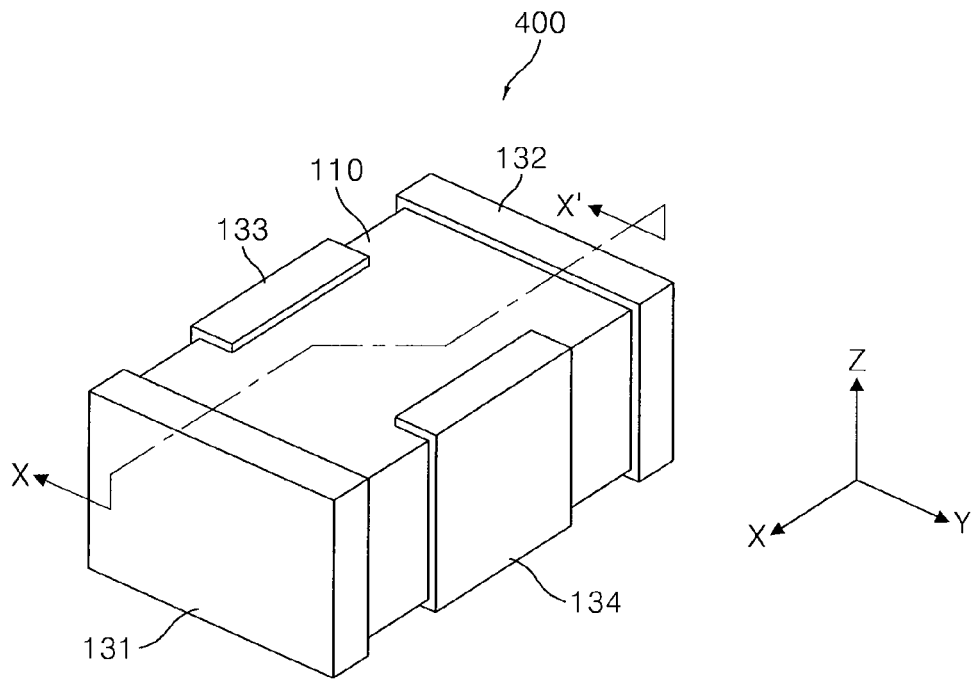
FIG. 39 is a perspective view illustrating the appearance of a multilayer chip capacitor according to another exemplary embodiment of the invention.
Figure 40:
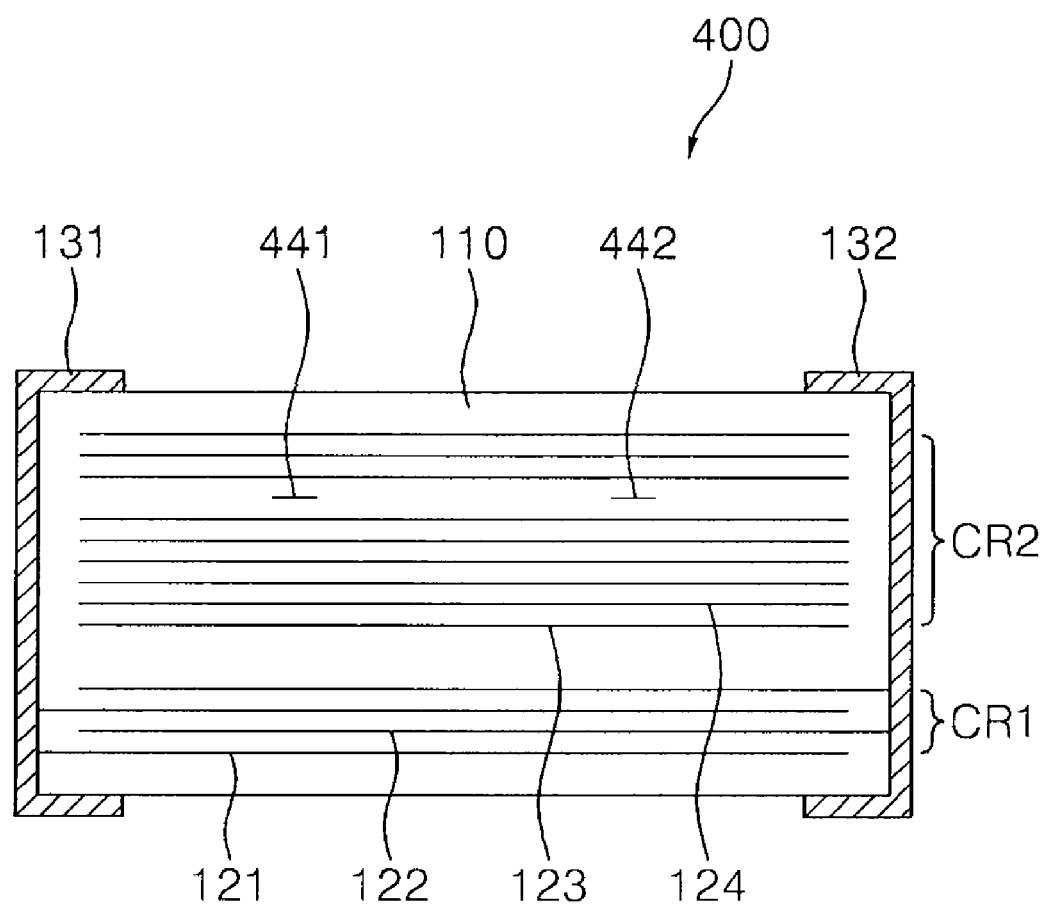
FIG. 40 is a cross-sectional view illustrating the appearance of a multilayer chip capacitor according to still another exemplary embodiment of the invention.
Figure 41:
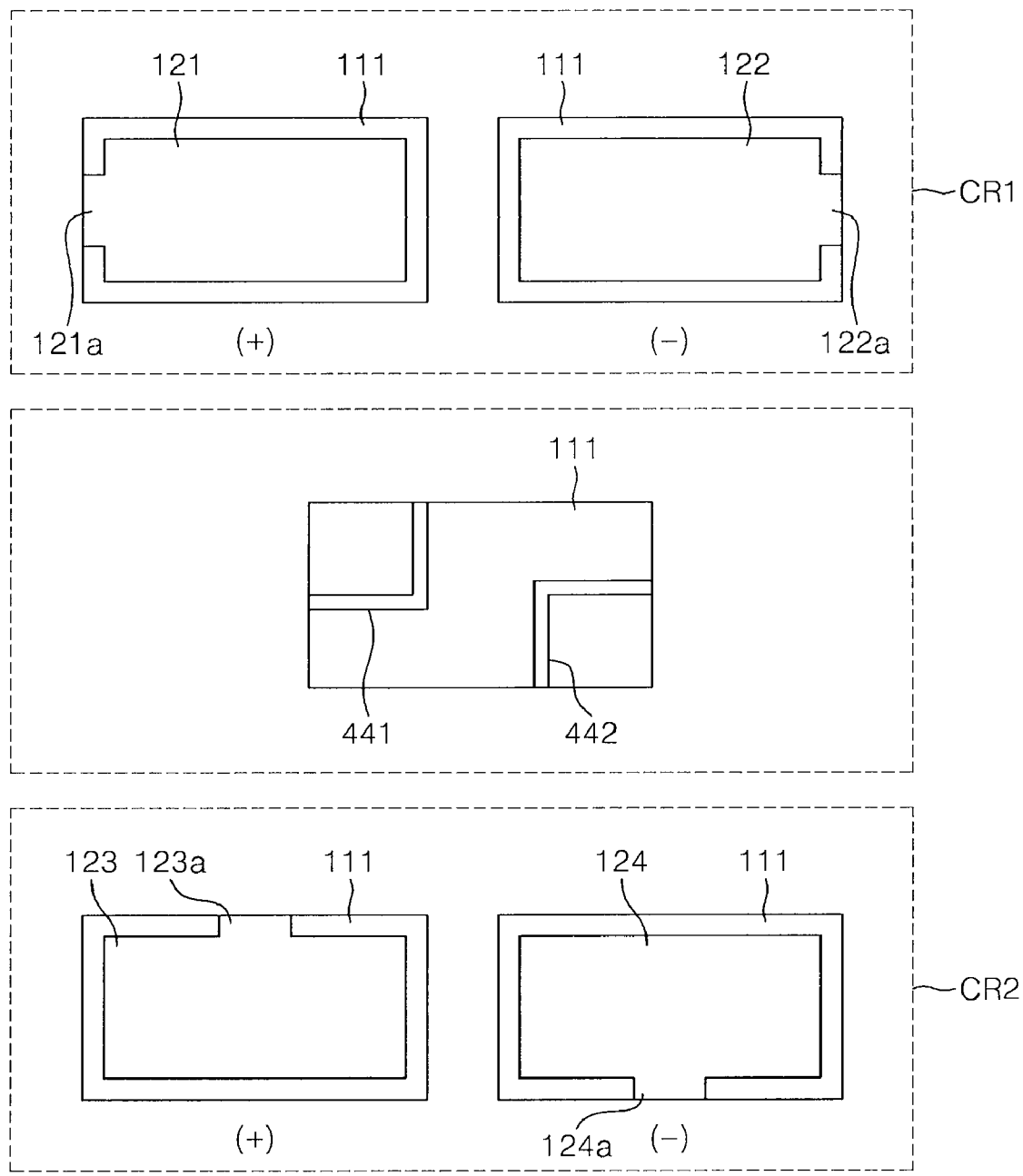
FIG. 41 is a plan view illustrating the appearance of a multilayer chip capacitor according to yet another exemplary embodiment of the invention.

FIGS. 39 and 40 are a perspective view and a cross-sectional view illustrating the appearance of a capacitor according to still another exemplary embodiment of the invention. FIG. 41 is a plan view illustrating an inner electrode structure of a capacitor according to still another exemplary embodiment of the invention. As shown, first to fourth outer electrodes 131 to 134 are formed on side surfaces of a capacitor body 110 of the capacitor 400. However, a connecting conductor line is not provided on the capacitor body 110 but inside the capacitor body 110. That is, as shown in FIGS. 40 and 41, a connecting conductor line 441 connecting a first outer electrode 131 and a third outer electrode 133 together and a connecting conductor line 442 connecting a second outer electrode 132 and a fourth outer electrode 134 together are formed on a dielectric layer 111 inside the body 110. Inner electrodes 121 to 124 other than the connecting conductor lines 441 and 442 and connection configuration thereof are identical to the previous embodiments.

As set forth above, according to exemplary embodiments of the invention, a multilayer capacitor ensures a low ESL and a high ESR without changing a material. Also, the capacitor can maintain impedance of a power distribution network at a constant level in a wide frequency range to easily realize a stable power distribution network.

While the present invention has been shown and described in connection with the exemplary embodiments, it will be apparent to those skilled in the art that modifications and variations can be made without departing from the spirit and scope of the invention as defined by the appended claims.

What is claimed is:

1. A multilayer chip capacitor comprising:
   a capacitor body having a plurality of dielectric layers laminated therein, the capacitor body comprising first and second capacitor units disposed in a laminated direction;
   first to fourth outer electrodes formed on side surfaces of the capacitor body, respectively,
   wherein the first and third outer electrodes have identical polarity to each other and the second and fourth outer electrodes have identical polarity to each other but different polarities from the first outer electrode; and
   at least one connecting conductor line connecting the first outer electrode and the third outer electrode to each other and the second outer electrode and the fourth outer electrode to each other,
   wherein the first capacitor body comprises first and second inner electrodes of different polarities disposed to oppose each other while interposing a corresponding one of the dielectric layers,
   the second capacitor unit comprises a plurality of third and fourth inner electrodes arranged alternately to oppose each other, while interposing corresponding ones of the dielectric layers, respectively
   the first to fourth outer electrodes are connected to the first to fourth inner electrodes, respectively, and
   an equivalent series resistance of the first capacitor unit and a combined equivalent series resistance of the second capacitor and the connecting conductor line satisfy the following Equation:

$$0.7(R1) \leq R2' \leq 1.3(R1) \qquad \text{Equation,}$$

where R2' is the combined equivalent series resistance of the second capacitor and the connecting conductor and R1 is the equivalent series resistance of the first capacitor unit.

2. The multilayer chip capacitor of claim 1, wherein the equivalent series resistance of the first capacitor unit is substantially identical to the combined equivalent series resistance of the second capacitor and the connecting conductor.

3. The multilayer chip capacitor of claim 1, wherein the equivalent series resistance of the first capacitor unit, the combined equivalent series resistance of the second capacitor and the connecting conductor, a capacitance of the first capacitor unit and a combined equivalent series inductance of the second capacitor unit and the connecting conductor line satisfy the following Equation:

$$R1 = R2' = \sqrt{L2'/C1} \quad \text{Equation,}$$

where R1 is the equivalent series resistance of the first capacitor unit, R2' is the combined equivalent series resistance of the second capacitor and the connecting conductor, L2' is the combined equivalent series inductance of the second capacitor unit and the connecting conductor line, and C1 is the capacitance of the first capacitor unit.

4. The multilayer chip capacitor of claim 1, wherein the opposing first and second inner electrodes of the first capacitor unit have an overlapping area smaller than an overlapping area of the opposing third and fourth inner electrodes of the second capacitor.

5. The multilayer chip capacitor of claim 1, wherein the first and second inner electrodes of the first capacitor unit have lengths smaller than lengths of the third and fourth inner electrodes of the second capacitor unit.

6. The multilayer chip capacitor of claim 1, wherein the first and second inner electrodes of the first capacitor unit have widths smaller than widths of the third and fourth inner electrodes of the second capacitor unit.

7. The multilayer chip capacitor of claim 1, wherein the first and second inner electrodes of the first capacitor unit have an opening therein, respectively.

8. The multilayer chip capacitor of claim 1, the dielectric layer between the opposing first and second inner electrodes of the first capacitor unit has a thickness greater than a thickness of the dielectric layer between the opposing first and second inner electrodes of the second capacitor unit.

9. The multilayer chip capacitor of claim 1, wherein a total lamination number of the inner electrodes of the second capacitor unit is greater than a total lamination number of the inner electrodes of the first capacitor unit.

10. The multilayer chip capacitor of claim 1, wherein the first capacitor unit has an equivalent series resistance greater than an equivalent series resistance of the second capacitor unit.

11. The multilayer chip capacitor of claim 1, wherein the first capacitor unit has an equivalent series inductance smaller than an equivalent series inductance of the second capacitor unit.

12. The multilayer chip capacitor of claim 1, wherein the first capacitor unit is disposed in a lower part of the capacitor body and the second capacitor unit is disposed above the first capacitor unit.

13. The multilayer chip capacitor of claim 1, wherein the first capacitor unit is divided into upper and lower portions,
wherein the second capacitor unit is disposed between the upper and lower portions of the first capacitor unit and the upper and lower portions are disposed above and below the second capacitor unit, respectively.

14. The multilayer chip capacitor of claim 1, wherein the connecting conductor line comprises two connecting conductor lines disposed on a top and bottom of the capacitor body, respectively, and the first capacitor unit comprises two first capacitor units wherein the first capacitor units are arranged symmetrically in a laminated direction while interposing the second capacitor unit, and
the multilayer chip capacitor is horizontally symmetrical.

15. The multilayer chip capacitor of claim 1, wherein the connecting conductor line is formed on an outer surface of the capacitor body.

16. The multilayer chip capacitor of claim 15, wherein the at least one connecting conductor line comprises a first connecting conductor line connecting the first and third outer electrodes to each other and a second connecting conductor line connecting the second and fourth outer electrodes to each other.

17. The multilayer chip capacitor of claim 15, wherein the at least one connecting conductor line comprises one of a first connecting conductor line connecting the first and third outer electrodes to each other and a second connecting conductor line connecting the second and fourth outer electrodes to each other.

18. The multilayer chip capacitor of claim 1, wherein the connecting conductor line is formed on a corresponding one of the dielectric layers inside the capacitor body.

19. The multilayer chip capacitor of claim 1, wherein the connecting conductor line is adjusted in conductivity, length, width or thickness to control a series resistance added to the second capacitor unit.

20. The multilayer chip capacitor of claim 1, wherein the multilayer chip capacitor is a four-terminal capacitor including a respective one of the first to fourth outer electrodes.

21. The multilayer chip capacitor of claim 20, wherein the first and second outer electrodes are formed on two opposing longer side surfaces of the capacitor body and the third and fourth outer electrodes are formed on two opposing shorter side surfaces of the capacitor body.

22. The multilayer chip capacitor of claim 20, wherein the first and second outer electrodes are formed on two opposing longer side surfaces of the capacitor body and the third and fourth outer electrodes are formed on two opposing shorter side surfaces of the capacitor body.

23. The multilayer chip capacitor of claim 20, wherein the first and second inner electrodes are connected to the first and second outer electrodes through leads, respectively, and
the leads of the first and second inner electrodes are adjusted in width to control the equivalent series resistance of the first capacitor unit.

24. The multilayer chip capacitor of claim 20, wherein the third and fourth inner electrodes are connected to the third and fourth outer electrodes through leads, respectively, and
the leads of the third and fourth inner electrodes are adjusted in width to control the equivalent series resistance of the second capacitor unit.

25. A circuit board apparatus comprising:
the multilayer chip capacitor defined in claim 1; and
a circuit board comprising a mounting surface where the multilayer chip capacitor is mounted and an outer circuit electrically connected to the multilayer chip capacitor,
wherein first and second pads are formed on the mounting surface of the circuit board to connect to first and second outer electrodes of the multilayer chip capacitor, respectively, and the first and second pads are directly connected to the outer circuit,
the multilayer chip capacitor is arranged such that the first capacitor unit is disposed more adjacent to the mounting surface than the second capacitor unit.

26. The circuit board apparatus of claim 25, wherein an equivalent series resistance of the first capacitor unit is substantially identical to a combined equivalent series resistance of the second capacitor and the connecting conductor.

27. The circuit board apparatus of claim 25, wherein the equivalent series resistance of the first capacitor unit, the combined equivalent series resistance of the second capacitor and the connecting conductor, a capacitance of the first capacitor unit and a combined equivalent series inductance of the second capacitor unit and the connecting conductor line satisfy the following Equation:

$$R1 = R2' = \sqrt{L2'/C1}$$ Equation, where R1 is the equivalent series resistance of the first capacitor unit, R2' is the combined equivalent series resistance of the second capacitor and the connecting conductor, L2' is the combined equivalent series inductance of the second capacitor unit and the connecting conductor line, and C1 is the capacitance of the first capacitor unit.

28. The circuit board apparatus of claim 25, wherein the first capacitor unit has an equivalent series resistance greater than an equivalent series resistance of the second capacitor unit.

29. The circuit board apparatus of claim 25, wherein vias are formed inside the circuit board as a part of the outer circuit to connect to the first and second pads, respectively.

30. The circuit board apparatus of claim 25, wherein the at least one connecting conductor includes a first connecting conductor connecting the first and third outer electrodes to each other and a second connecting conductor connecting the second and fourth outer electrodes to each other.

31. The circuit board apparatus of claim 30, wherein a third pad is formed on the mounting surface of the circuit board to connect to the third outer electrode and a fourth pad is formed on the mounting surface of the circuit board to connect to the fourth outer electrode.

32. The circuit board apparatus of claim 25, wherein the at least one connecting conductor includes one of a first connecting conductor connecting the first and third outer electrodes to each other and a second connecting conductor connecting the second and fourth outer electrodes to each other.

33. The circuit board apparatus of claim 32, wherein the at least one connecting conductor line comprises the first connecting conductor line, and
a pad is additionally formed on the mounting surface of the circuit board to connect to the fourth outer electrode and directly connected to the outer circuit.

34. The circuit board apparatus of claim 33, wherein vias are formed inside the circuit board as a part of the outer circuit to connect to the pad connected to the fourth outer electrode, the first pad and the second pad, respectively.

35. The circuit board apparatus of claim 32, wherein the at least one connecting line comprises the second connecting conductor line, and
a pad is additionally formed on the mounting surface of the circuit board to connect to the third outer electrode and directly connected to the outer circuit.

36. The circuit board apparatus of claim 35, wherein vias are formed inside the circuit board as a part of the outer circuit to connect to the pad connected to the third outer electrode, the first pad and the second pad, respectively.

37. The circuit board apparatus of claim 25, wherein the multilayer chip capacitor is a four-terminal capacitor having a respective one of the first to fourth outer electrodes,
the first and second outer electrodes are disposed on two opposing shorter side surfaces of the capacitor body and the third and fourth outer electrodes are disposed on two opposing longer side surfaces of the capacitor body.

38. The circuit board apparatus of claim 25, wherein the opposing first and second inner electrodes of the first capacitor unit have an overlapping area smaller than an overlapping area of the opposing third and fourth inner electrodes of the second capacitor.

39. The circuit board apparatus of claim 25, wherein the dielectric layer between the opposing first and second inner electrodes of the first capacitor unit has a thickness greater than a thickness of the dielectric layer between the opposing first and second inner electrodes of the second capacitor unit.

* * * * *